United States Patent
Nuttgens

(10) Patent No.: US 9,300,405 B2
(45) Date of Patent: Mar. 29, 2016

(54) CLOSED LOOP OPTICAL MODULATION AMPLITUDE CONTROL

(71) Applicant: Semtech Corporation, Camarillo, CA (US)

(72) Inventor: Jonah Nuttgens, Southampton (GB)

(73) Assignee: Semtech Corporation, Camarillo, CA (US)

( * ) Notice: Subject to any disclaimer, the term of this patent is extended or adjusted under 35 U.S.C. 154(b) by 148 days.

(21) Appl. No.: 14/011,022

(22) Filed: Aug. 27, 2013

(65) Prior Publication Data

US 2014/0186056 A1 Jul. 3, 2014

Related U.S. Application Data

(63) Continuation-in-part of application No. 13/309,951, filed on Dec. 2, 2011, now Pat. No. 8,548,336.

(60) Provisional application No. 61/731,000, filed on Nov. 29, 2012.

(51) Int. Cl.
 *H04B 10/50* (2013.01)
 *H01S 5/00* (2006.01)
 *H04B 10/564* (2013.01)

(52) U.S. Cl.
 CPC ........ *H04B 10/50572* (2013.01); *H04B 10/504* (2013.01); *H04B 10/564* (2013.01)

(58) Field of Classification Search
 CPC ........... H04B 10/50572; H04B 10/504; H04B 10/564
 USPC ................................. 398/182–201; 372/9–32
 See application file for complete search history.

(56) References Cited

U.S. PATENT DOCUMENTS

| | | | | | |
|---|---|---|---|---|---|
| 4,166,985 | A | * | 9/1979 | White | H01S 5/06835 372/30 |
| 4,307,469 | A | * | 12/1981 | Casper | H04B 10/504 398/195 |
| 4,592,057 | A | * | 5/1986 | Comerford | H01S 5/0683 250/205 |

(Continued)

FOREIGN PATENT DOCUMENTS

| | | |
|---|---|---|
| CA | 1229653 | 11/1987 |
| EP | 0649201 A1 | 4/1995 |

OTHER PUBLICATIONS

Notification Concerning Transmittal of International Preliminary Report on Patentability dated Jun. 12, 2014 from related / corresponding PCT/GB2012/000878 filed Nov. 30, 2012.

(Continued)

*Primary Examiner* — Ken Vanderpuye
*Assistant Examiner* — Dibson Sanchez
(74) *Attorney, Agent, or Firm* — Jones Day

(57) ABSTRACT

Systems and methods are provided for a low frequency AC comparison circuit. The low frequency AC comparison circuit includes circuitry configured to receive a monitoring signal generated by an optical detector, the monitoring signal being proportional to an amount of light generated by an optical transmission device that transmits based on a data signal that is received by an optical driver. The comparison circuit is further configured to generate a modulation current control signal that is transmitted to the optical driver based on a comparison of a low frequency AC component of the monitoring signal and a correlated low frequency AC component of the data signal.

32 Claims, 22 Drawing Sheets

(56) References Cited

U.S. PATENT DOCUMENTS

| | | | | |
|---|---|---|---|---|
| 4,621,376 | A * | 11/1986 | Nakamura | H01S 5/06835 372/29.01 |
| 4,733,398 | A | 3/1988 | Shibagaki et al. | |
| 4,813,048 | A * | 3/1989 | Yamane | H01S 5/06216 372/25 |
| 4,856,011 | A * | 8/1989 | Shimada | G11B 7/126 250/205 |
| 4,864,649 | A * | 9/1989 | Tajima | H04B 10/504 372/25 |
| 5,373,387 | A | 12/1994 | Bosch et al. | |
| 5,444,564 | A * | 8/1995 | Newberg | H03H 7/40 333/17.3 |
| 5,448,629 | A * | 9/1995 | Bosch | H01S 5/06835 372/29.014 |
| 5,452,117 | A * | 9/1995 | Epworth | H04B 10/69 372/29.02 |
| 5,548,435 | A * | 8/1996 | Tahara | H04B 10/564 372/38.02 |
| 5,675,600 | A * | 10/1997 | Yamamoto | H01S 5/0683 372/38.01 |
| 5,745,275 | A * | 4/1998 | Giles et al. | 398/94 |
| 5,812,572 | A | 9/1998 | King et al. | |
| 5,978,393 | A | 11/1999 | Feldman et al. | |
| 6,282,216 | B1 * | 8/2001 | Ikeuchi et al. | 372/29.015 |
| 6,597,485 | B1 * | 7/2003 | Ikeuchi et al. | 398/192 |
| 6,661,817 | B1 * | 12/2003 | Ames et al. | 372/29.021 |
| 6,795,656 | B1 * | 9/2004 | Ikeuchi | H01S 5/042 372/29.014 |
| 7,418,018 | B2 * | 8/2008 | Tanaka | H01S 5/042 372/29.02 |
| 7,711,272 | B2 * | 5/2010 | Blauvelt | H04B 10/58 398/197 |
| 8,086,111 | B2 * | 12/2011 | Miller | H04B 10/564 398/195 |
| RE43,685 | E * | 9/2012 | Sanchez | H01S 3/30 372/38.02 |
| 8,346,097 | B1 * | 1/2013 | Benzoni | H04B 10/25759 398/195 |
| 2003/0021858 | A1 | 1/2003 | Bababunmi | |
| 2003/0218585 | A1 * | 11/2003 | Hoshi | H04B 10/564 345/82 |
| 2004/0013428 | A1 * | 1/2004 | Nakajima et al. | 398/43 |
| 2004/0052281 | A1 * | 3/2004 | Hamajima | H01S 5/06832 372/38.01 |
| 2004/0165622 | A1 | 8/2004 | Lu | |
| 2005/0238072 | A1 * | 10/2005 | Uesaka | 372/38.02 |
| 2006/0098699 | A1 * | 5/2006 | Sanchez | 372/26 |
| 2006/0108517 | A1 | 5/2006 | Draper et al. | |
| 2006/0153256 | A1 * | 7/2006 | Sanchez | 372/34 |
| 2006/0165139 | A1 * | 7/2006 | Sanchez | 372/29.021 |
| 2008/0013151 | A1 | 1/2008 | Draper | |
| 2008/0063412 | A1 * | 3/2008 | Ishibashi | 398/197 |
| 2008/0219678 | A1 * | 9/2008 | Doi | G02F 1/0123 398/198 |
| 2009/0214198 | A1 * | 8/2009 | Takahashi et al. | 398/1 |
| 2009/0232517 | A1 | 9/2009 | Farina et al. | |
| 2009/0268766 | A1 * | 10/2009 | Ishibashi | 372/38.02 |
| 2013/0142506 | A1 | 6/2013 | Nuttgens | |

OTHER PUBLICATIONS

European Extended Search Report dated Dec. 18, 2014 from related/corresponding European patent application serial No. 14182129.8, filed Aug. 25, 2014.

Communication pursuant to Article 94(3) EPC dated Oct. 16, 2015 from related/corresponding European patent application No. 12813932.6, filed Nov. 30, 2012.

Office Action with Search Report with English translation dated Sep. 10, 2015 from related Taiwan patent application No. 103129415 filed Aug. 26, 2014.

Communication pursuant to Article 94(3) EPC dated Nov. 26, 2015 issued in related/corresponding EP Patent Appl. No. 14182129.8 filed Aug. 25, 2014.

Office Action dated Dec. 2, 2015 issued in related/corresponding Chinese Patent Application No. 201280059500.1 filed Jun. 3, 2014.

* cited by examiner

CLOSED LOOP OPTICAL MODULATION AMPLITUDE CONTROL

CROSS REFERENCE TO RELATED APPLICATIONS

This application claims priority to U.S. Provisional Patent Application No. 61/731,000 filed Nov. 29, 2012, entitled "Closed Loop Optical Modulation Amplitude Control," the entirety of which is herein incorporated by reference.

This application is a continuation-in-part of U.S. patent application Ser. No. 13/309,951, filed Dec. 2, 2011, entitled "Closed Loop Optical Modulation Amplitude Control," the entirety of which is herein incorporated by reference.

FIELD

The technology described herein relates generally to data transmission and more particularly to optical data transmitter control.

BACKGROUND

Optic communication involves the transmission of information from one place to another by sending pulses of light, such as through an optical fiber. The light forms a carrier wave that is modulated to carry information. Optic communications are known for their low loss nature and high data-carrying capacity. However, these perceived advantages of an optical communication system can be mitigated when the quality of optical data signal generation is not adequately controlled.

SUMMARY

In accordance with the teachings herein, systems and methods are provided for a low frequency comparison circuit. The low frequency comparison circuit includes circuitry configured to receive a monitoring signal generated by an optical detector, the monitoring signal being proportional to an amount of light generated by an optical transmission device that transmits based on a data signal that is received by an optical driver. The comparison circuit is further configured to generate a modulation current control signal that is transmitted to the optical driver based on a comparison of a low frequency component of the monitoring signal and a low frequency component of the data signal.

As another example, an optical module includes an optical driver configured to output a driver signal based on a received data signal, where a modulation amplitude of the driver signal is controlled according to a received modulation current control signal. A laser diode is configured to transmit light based on the driver signal. An optical detector is configured to generate a monitoring signal that is proportional to an amount of light generated by the optical transmission device. A low frequency comparison circuit includes circuitry configured to receive the monitoring signal generated by an optical detector and generate the modulation current control signal that is transmitted to the optical driver based on a comparison of a low frequency component of the monitoring signal and a low frequency component of the data signal.

BRIEF DESCRIPTION OF THE DRAWINGS

FIGS. 7 and 8 depict a number of plots of example data signals at particular points in the configuration of FIG. 6

DETAILED DESCRIPTION

An optical transmitter, such as, a light-emitting diode (LED) transmitter, a VCSEL transmitter, or a laser diode transmitter, includes components for generating light that is modulated to carry information. For example, a laser diode transmitter includes a laser diode and a laser diode driver that generates a driver signal that is transmitted to the laser diode to generate the data carrying light signal.

The laser diode driver receives one or more input signals that are processed to generate the driver signal. For example, a laser diode driver may receive a data input signal that contains data that is to be modulated into the light signal for transmission as well as one or more parameter adjustment inputs, such as a modulation current control input and a bias current control input. A modulation current control input controls the absolute difference in optical power output between a logic "1" and a logic "0," and a bias current control input controls an average optical power output of the laser diode. Because performance of an optical transmitter may vary based on a number of factors such as changes in temperature, variation in transmitter characteristics over time, etc., control mechanisms can be incorporated into an optical transmitter configuration to ensure that the optical transmitter functions in a desired operating range so as to maintain a high signal quality and minimize power dissipation.

Figure 1:
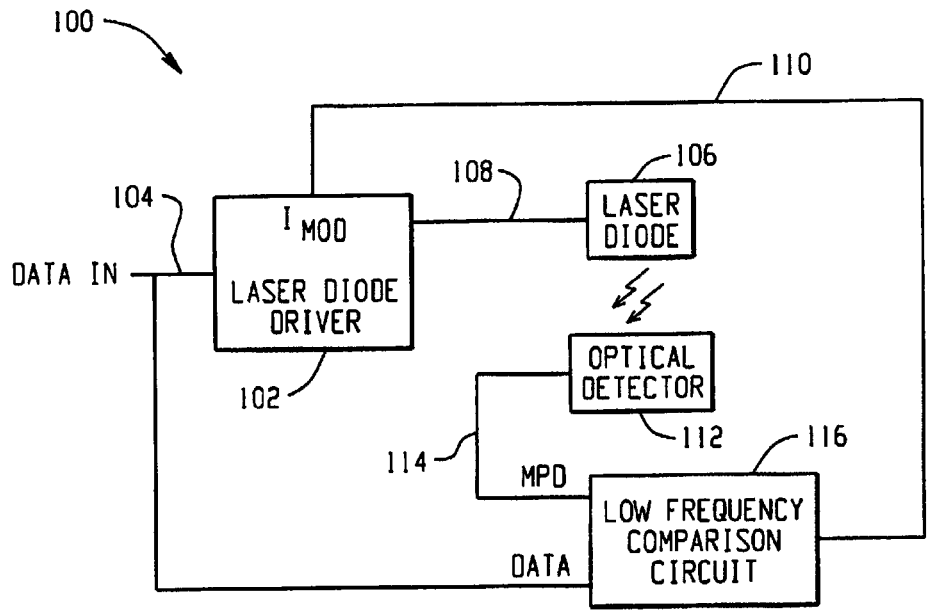
FIG. 1 is a block diagram depicting an optical transmitter configuration that includes closed loop optical modulation amplitude control.

FIG. 1 is a block diagram depicting an optical transmitter configuration that includes closed loop optical modulation amplitude (OMA) control. A laser diode driver 102 receives a data input signal 104 that supplies data that is to be modulated onto a light signal by a laser diode 106 according to a driver signal 108 transmitted by the laser diode driver 102. The laser diode driver 102 also receives an OMA control feedback signal ($I_{MOD}$) 110 that regulates the absolute difference in optical power output of the laser diode 106 between a logic "1" and a logic "0." The modulation control feedback signal 110 is generated via closed loop monitoring control. An optical detector, such as a monitor photo diode 112, detects an amount of light generated by the laser diode 106 and outputs a monitoring signal 114 that is proportional to the amount of light detected. A low frequency comparison circuit 116 receives the monitoring signal 114 and the data signal 104. The low frequency comparison compares a low frequency component of the monitoring signal 114 and a low frequency component of the data signal 104 to generate the modulation control feedback signal 110 that is transmitted to the laser diode driver 102 to regulate the optical modulation amplitude.

Figure 2:
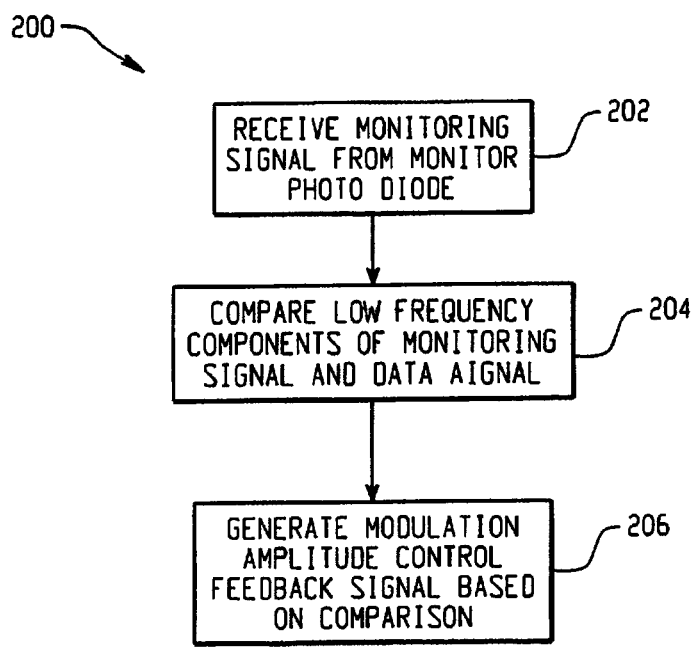
FIG. 2 is a flow diagram depicting a method of performing optical modulation amplitude feedback control.

FIG. 2 is a flow diagram depicting a method of performing optical modulation amplitude feedback control. At 202, a monitoring signal is received from an optical detector that is proportional to an amount of light generated by an optical transmission device that transmits based on a data signal received by an optical driver. At 204, a comparison is made between a low frequency component of the monitoring signal and a low frequency component of the data signal, and at 206, a modulation control feedback signal is generated and transmitted to the optical driver based on the comparison.

Figure 3:
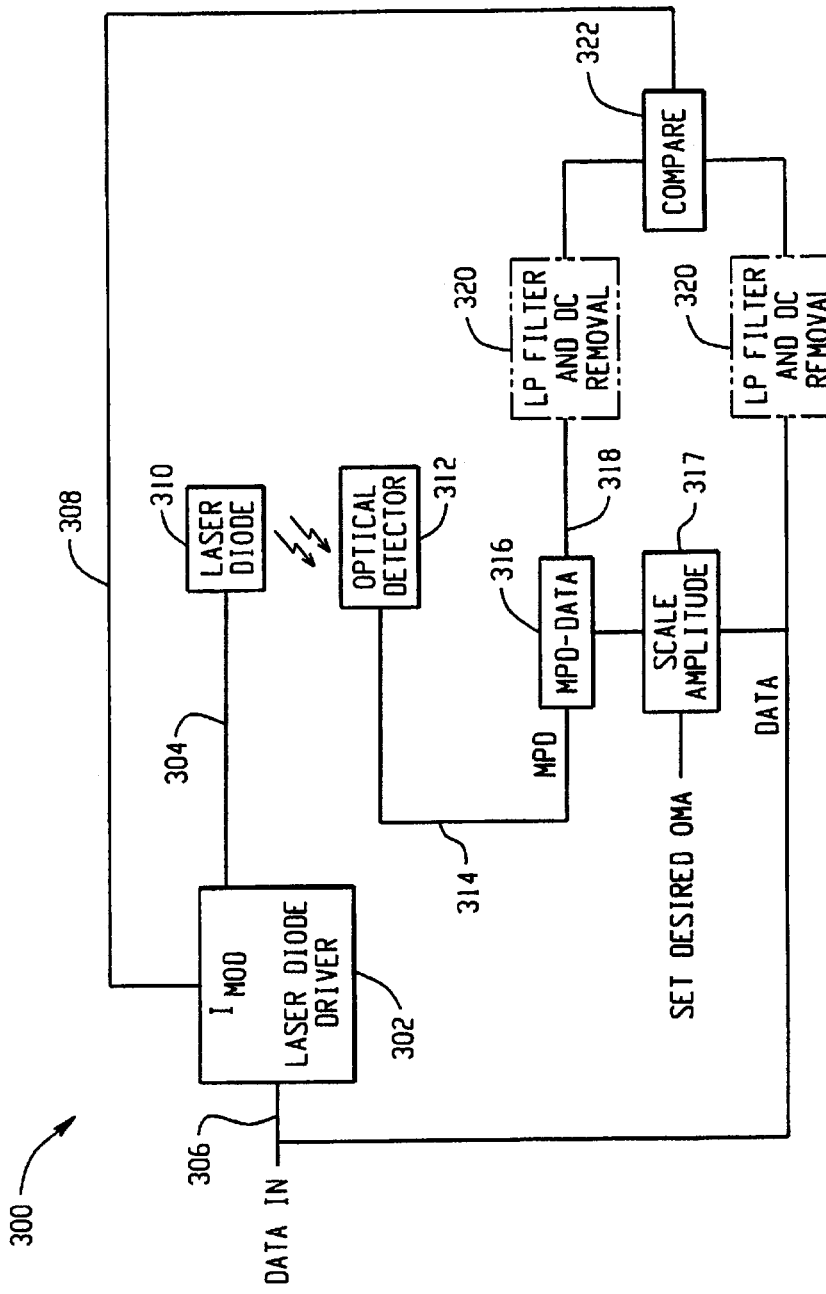
FIG. 3 is a block diagram depicting an optical modulation feedback circuit that filters one or both of a monitoring signal and a data signal.

FIG. 3 is a block diagram depicting an optical modulation feedback circuit that filters one or both of a monitoring signal and a data signal. A laser diode driver 302 generates a driver signal 304 based on a data input signal 306 and an optical modulation amplitude current feedback signal 308. The driver signal 304 is transmitted to a laser diode 310 for data transmission. A monitor photo diode 312 acts as an optical detector that generates a monitor signal 314 that is proportional to an amount of light generated by the laser diode 310. The monitor signal 314 and the data signal 306 are transmitted to a subtractor 316 that subtracts a value proportional to the data signal (e.g., via amplitude scaler 317) from the monitor signal 314 that is proportional to the light transmitted by the laser diode 310 to generate a residue signal 318. If the OMA of the transmitter is on target, then the residue signal 318 will be close to zero. If the OMA is greater than the target, then the residue signal will be in phase with the digital signal, and if the OMA is less than the target, then the residue signal will be out of phase with the data signal.

At 320, one or both of the residue signal 318 and the data signal 306 are filtered to remove high frequency components of the signal and AC-coupled to remove the DC component of the signal. For example, the signals 306, 318 may be transmitted to a low pass filter 320 that filters signal components having a frequency approaching or greater than the bandwidth of the monitor photo diode 312, which are sometimes band-limited devices having a maximum bandwidth of $\omega_{MAX}$. In such a configuration, the low pass filter(s) 320 may be configured to filter out high frequency components approaching or greater than $\omega_{MAX}$. At 322, the low frequency components are compared to generate the modulation control feedback signal 308 that is transmitted to the laser diode driver 302. For example, the filtered residue signal 318 and data signal 306 may be compared by multiplying (mixing) or correlating the two signals 306, 318 to generate the modulation control feedback signal 308.

Figure 4:
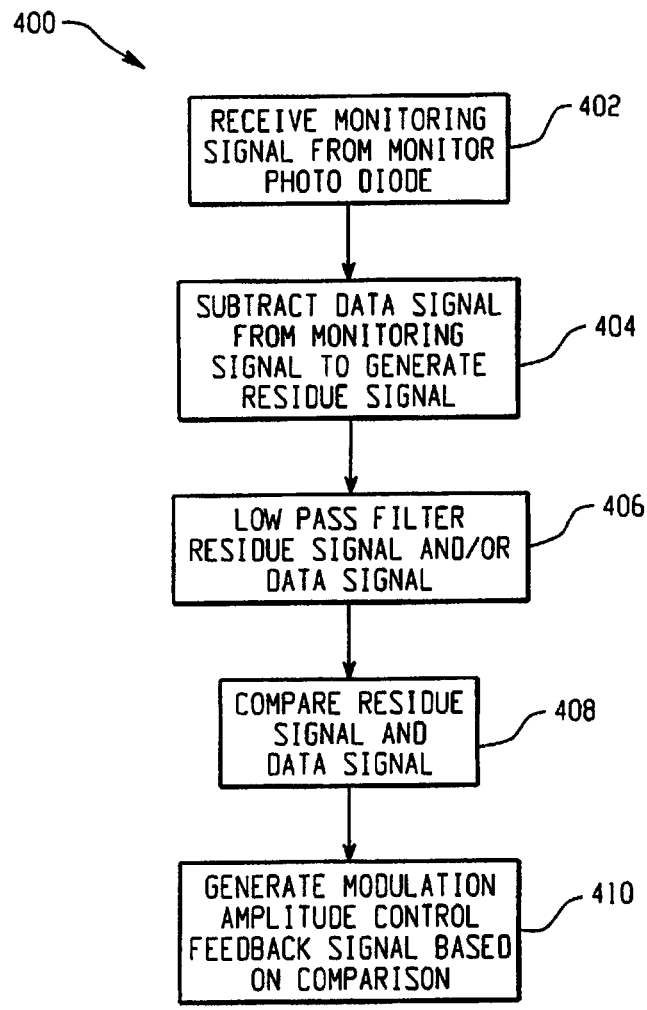
FIG. 4 is a flow diagram depicting a method of performing optical modulation amplitude feedback control.

FIG. 4 is a flow diagram depicting a method of performing optical modulation amplitude feedback control. At 402, a monitoring signal is received from an optical detector, such as a monitor photo diode, that is proportional to an amount of light generated by an optical transmission device that transmits based on a data signal received by an optical driver. At 404, a signal proportional to the data signal is subtracted from the monitoring signal to generate a residue signal, and at 406, one or both of the residue signal and the data signal are transmitted to a low pass filter. At 408, a comparison is made between the low frequency component of the monitoring signal and the low frequency component of the data signal. For example, the comparison may be performed by multiplying or correlating the residue signal and the data signal. At 410, a modulation control feedback signal is generated that is transmitted to the optical driver and is based on the comparison at 408.

Figure 5A:
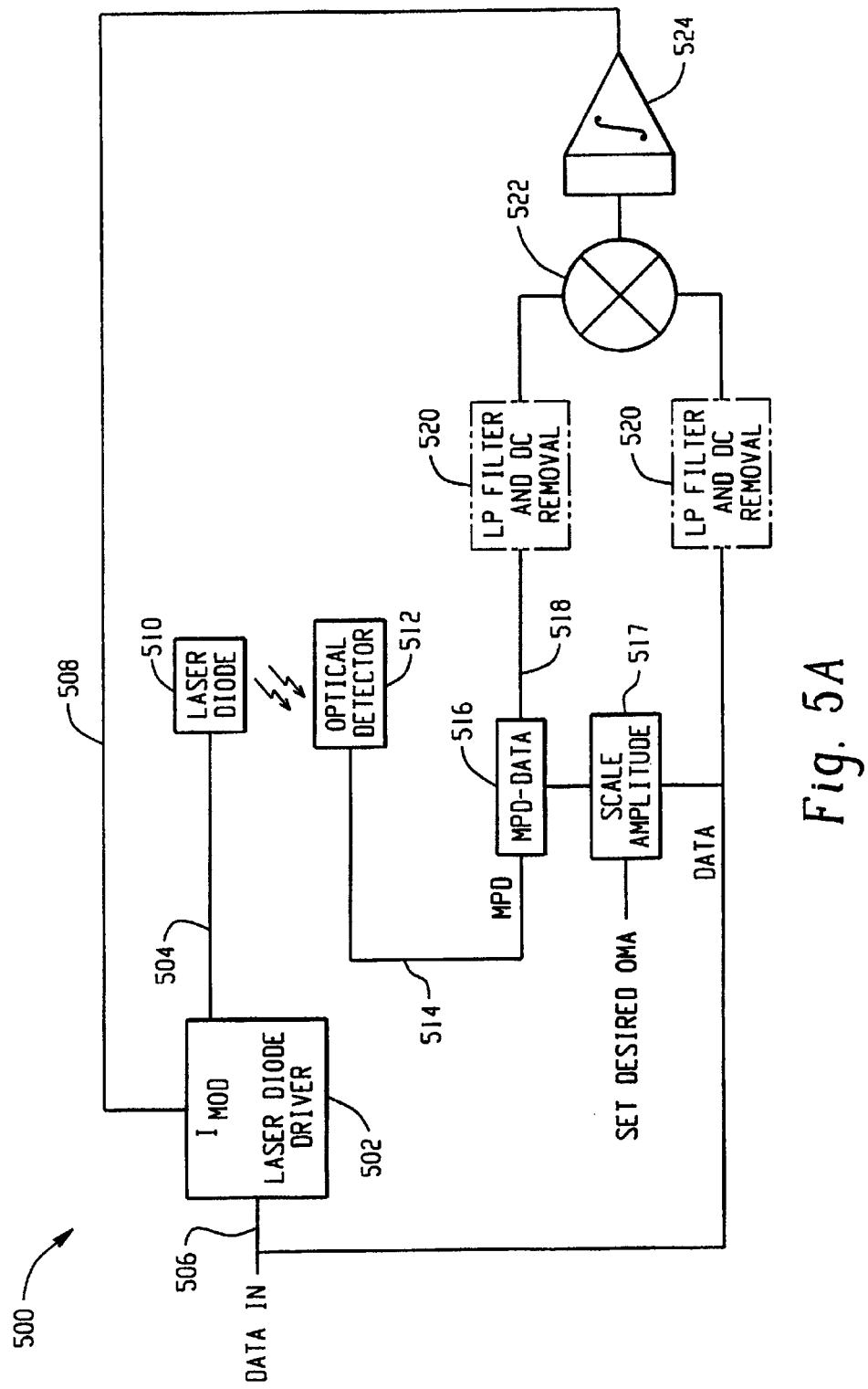
FIGS. 5A and 5B are block diagrams of an optical modulation feedback circuit depicting example details of a comparison between a monitor signal and a data signal.
Figure 5B:
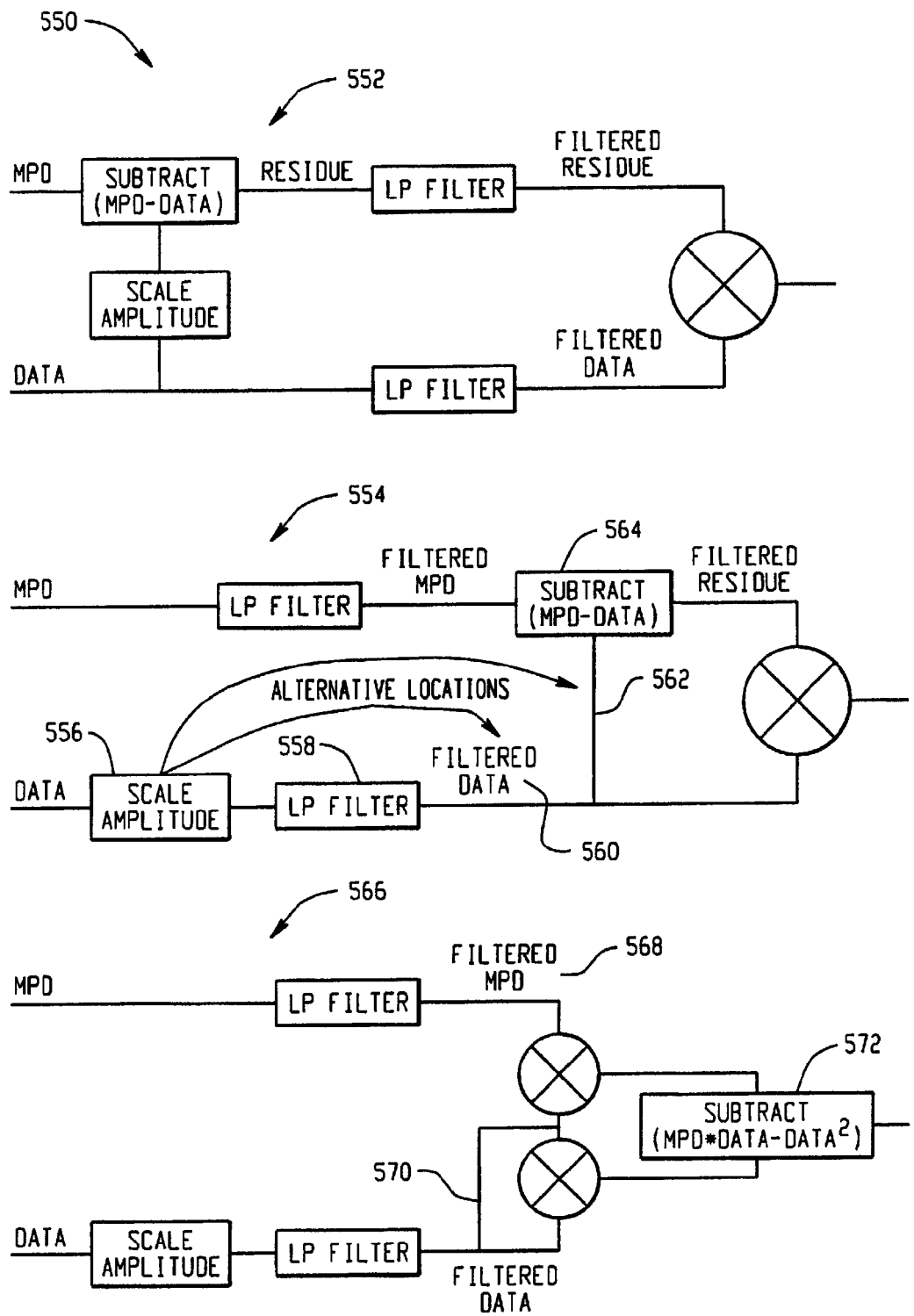

FIGS. 5A and 5B are block diagrams of an optical modulation feedback circuit depicting example details of a comparison between a monitor signal and a data signal. In FIG. 5A, a laser diode driver 502 generates a driver signal 504 based on a data input signal 506 and an optical modulation amplitude current feedback signal 508. The driver signal 504 is transmitted to a laser diode 510 for data transmission. A monitor photo diode 512 acts as an optical detector that generates a monitor signal 514 that is proportional to an amount of light generated by the laser diode 510. The monitor signal 514 and the data signal 506 are transmitted to a subtractor 516 that subtracts a value proportional to the data signal 506 from the monitor signal 514 that is proportional to the light transmitted by the laser diode 510 to generate a residue signal 518.

At 520, one or both of the residue signal 518 and the data signal 506 are filtered to remove high frequency components of the signal and may be AC-coupled to remove the DC component of the signal. At 522, the low frequency components are compared. For example, the filtered residue signal 518 and data signal 506 may be compared by multiplying the two signals 506, 518. The output of the multiplying 522 is transmitted to an integrator 524 to generate the modulation control feedback signal 508.

FIG. 5B depicts alternate configurations for providing the comparison between a monitor signal and a data signal in FIG. 5A. The alternate configurations may provide similar or equivalent performance as each other alternate configuration. The comparison configuration of FIG. 5A is shown at 552. At 554, scaling of the data signal is moved to one of: before 556 the low pass filtering 558 of the data signal, after 560 the low pass filtering 558 of the data signal but before the branch 562 to the subtractor 564, and on the branch 562 to the subtractor 564. At 566, a filtered form of the monitor signal 568 and a scaled and filtered form of the data signal are mixed and then provided to a subtractor 572.

Figure 6:
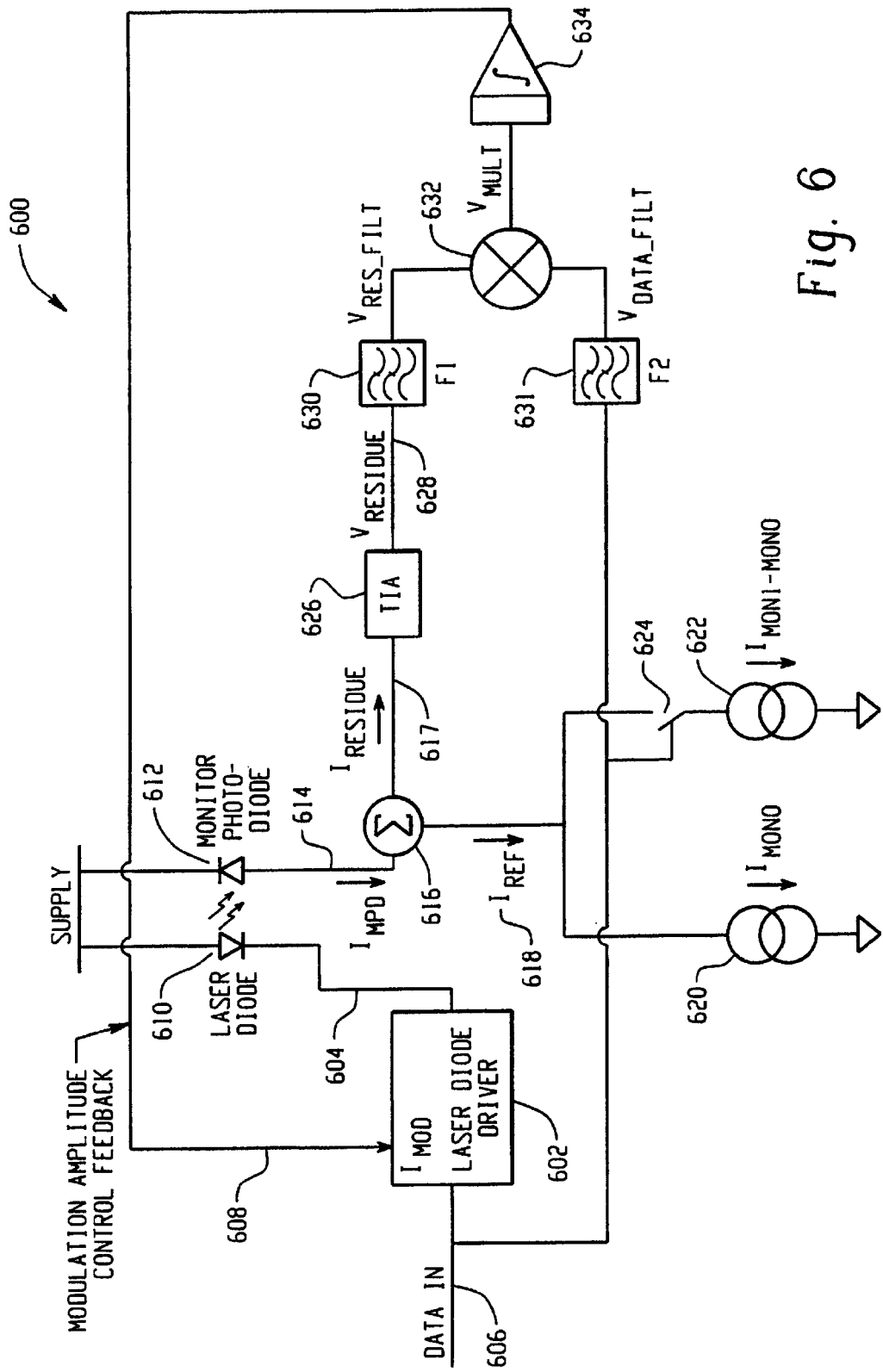
FIG. 6 is a block diagram of an optical modulation feedback circuit depicting example details of a subtractor circuit.
Figures 7A, 7B, 7C:
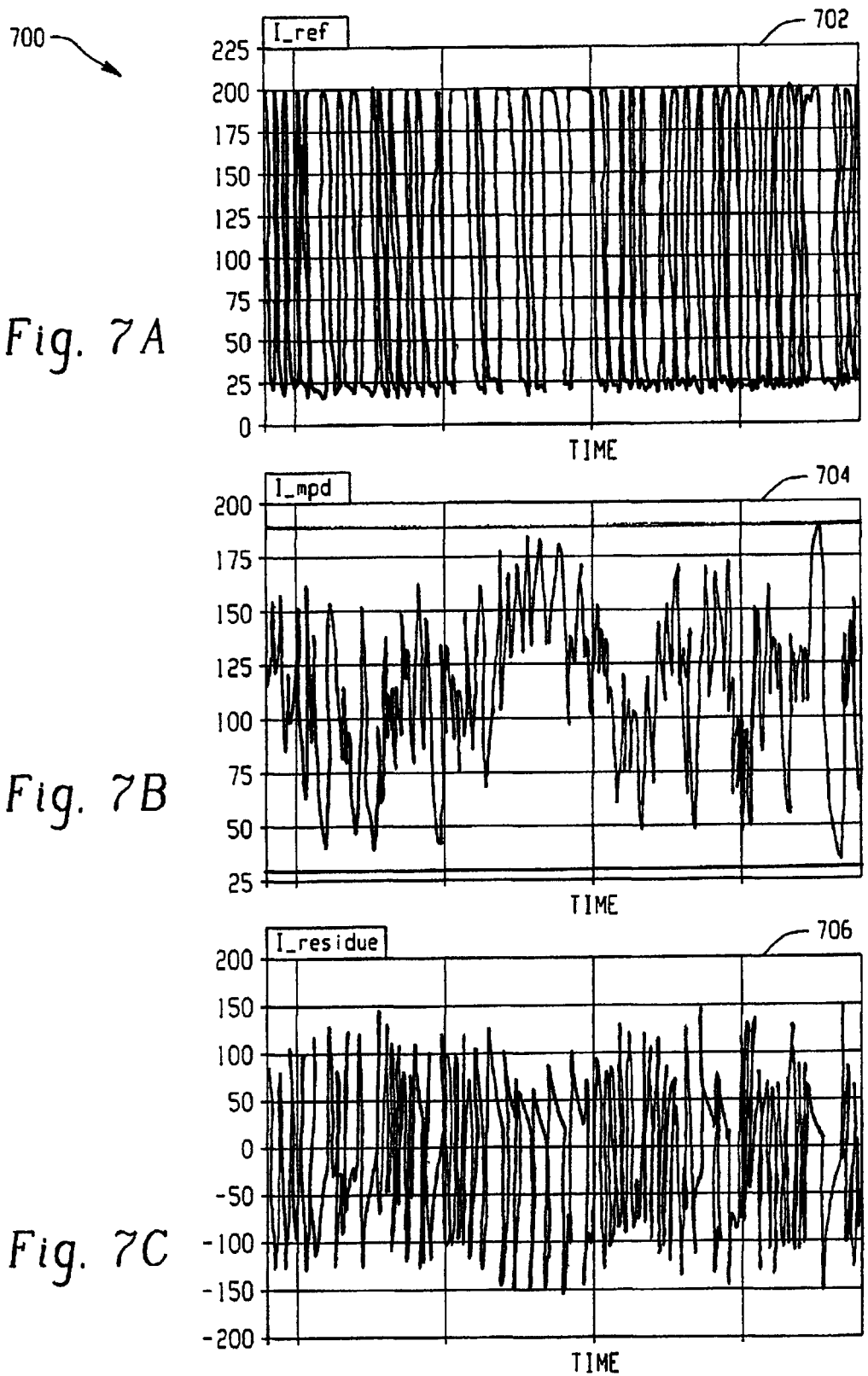
-FIG. 7A depicts the $I_{REF}$ signal.
FIG. 7B depicts the monitor current signal.
FIG. 7C depicts the $I_{RESIDUE}$ signal.
Figure 7D:
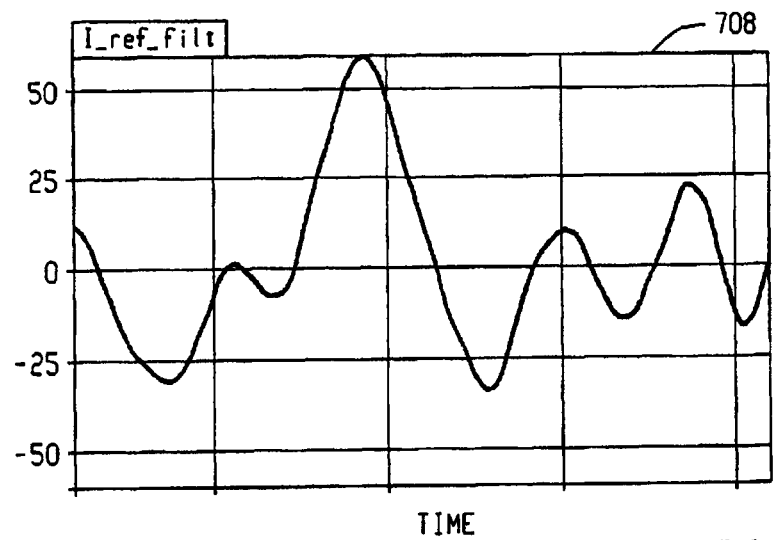
FIG. 7D depicts a filtered version of the $I_{REF}$ signal.
Figure 7E:
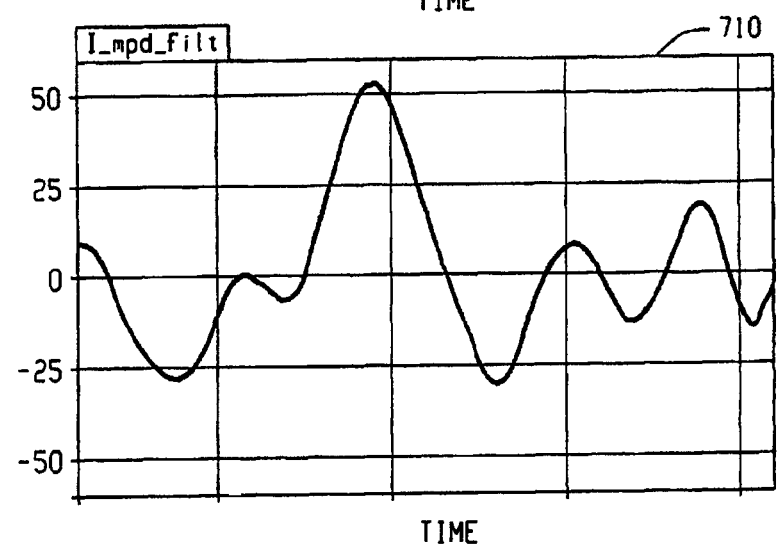
FIG. 7E depicts a filtered version of the $I_{MPD}$ signal.
Figure 7F:
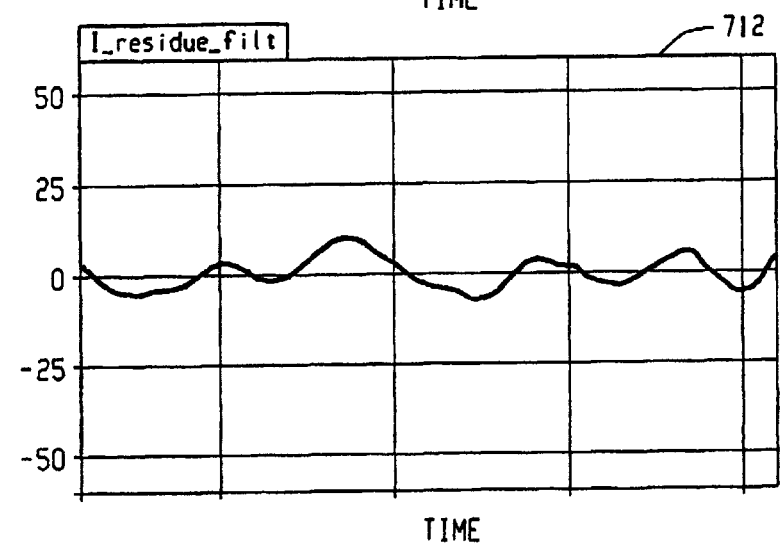
FIG. 7F depicts a filtered version of the $I_{RESIDUE}$ signal.
Figure 7G:
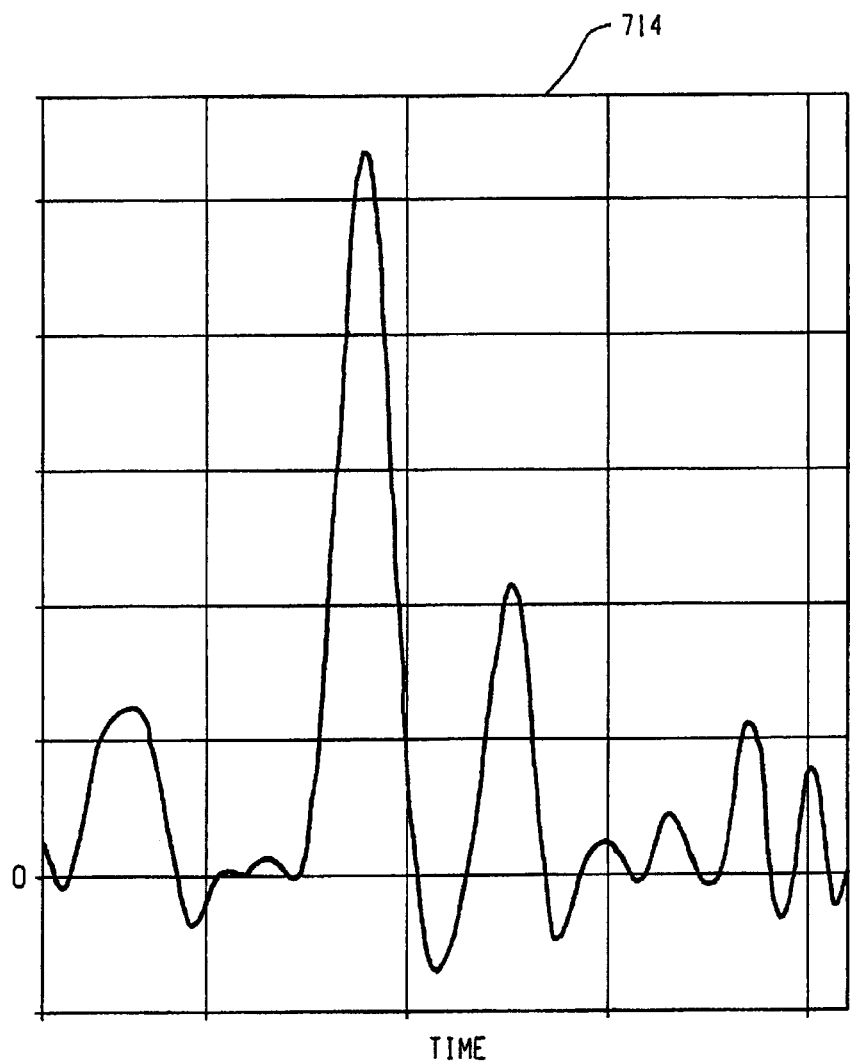
FIG. 7G depicts the $V_{MULT}$ signal in an example; and in a second example.
Figure 8A:
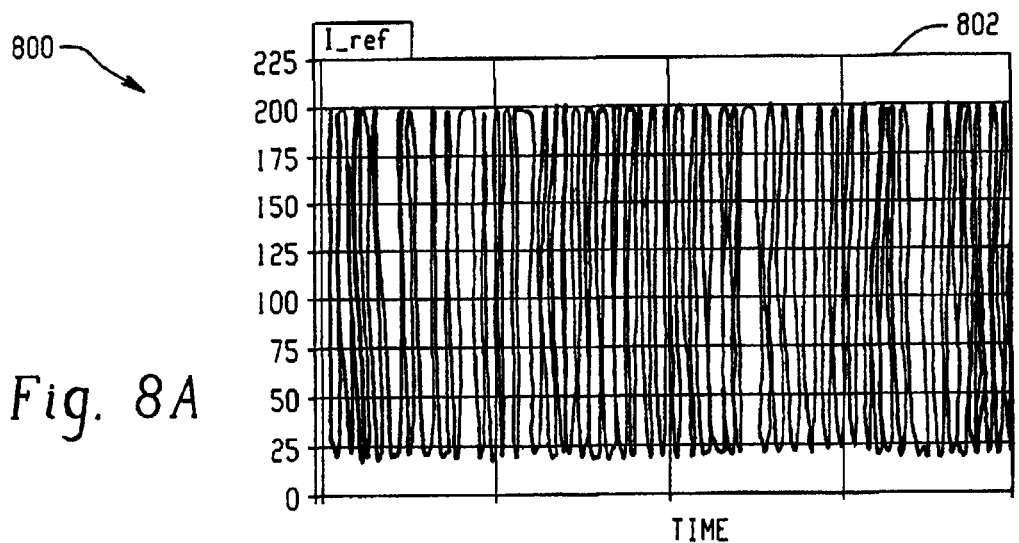
FIG. 8A depicts the $I_{REF}$ signal.
Figure 8B:
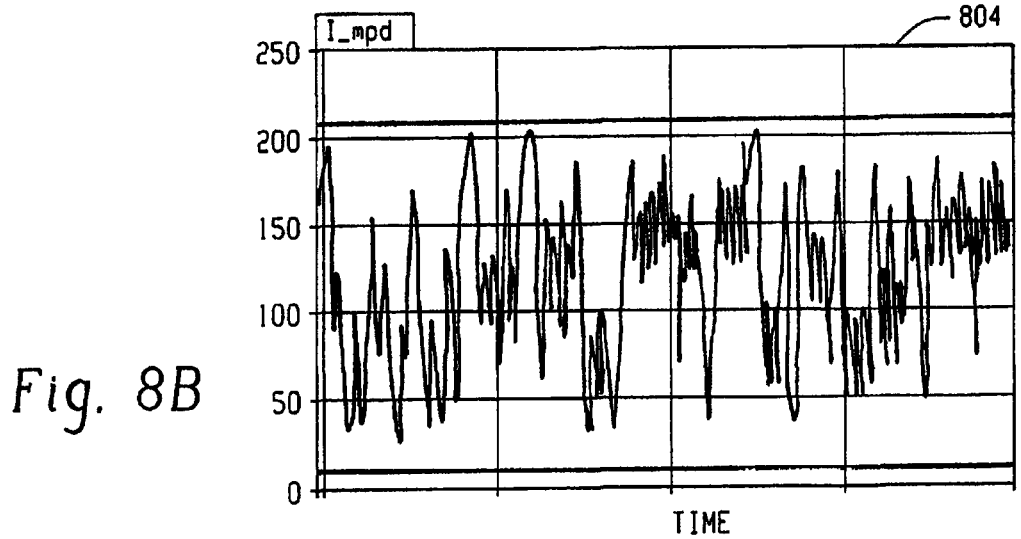
FIG. 8B depicts the monitor current signal.
Figure 8C:
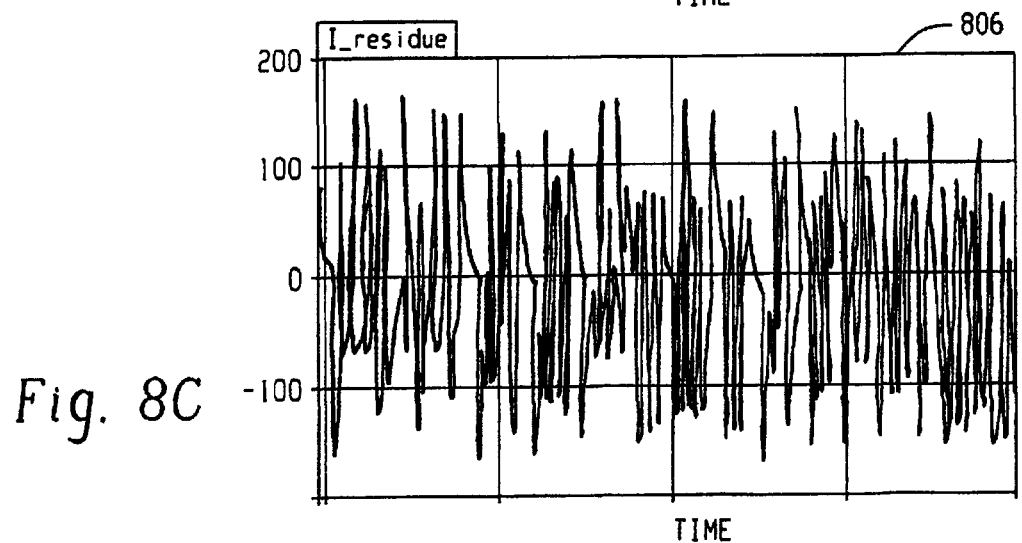
FIG. 8C depicts the $I_{RESIDUE}$ signal.
Figure 8D:
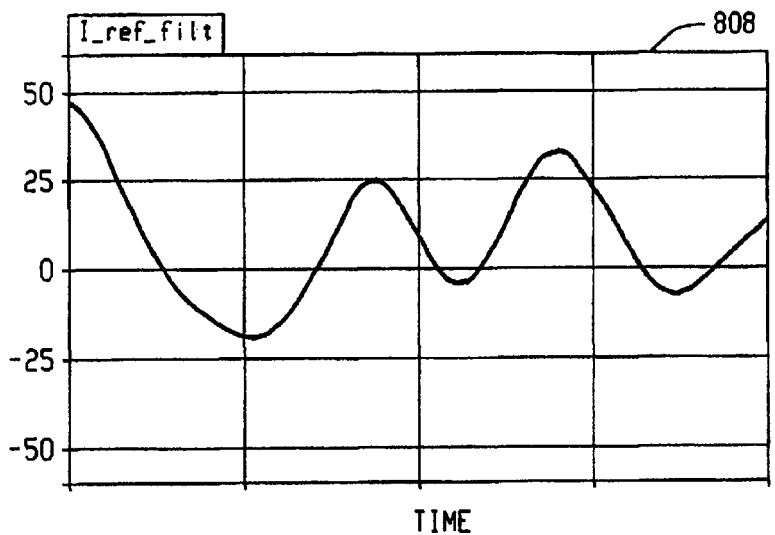
FIG. 8D depicts a filtered version of the $I_{REF}$ signal.
Figure 8E:
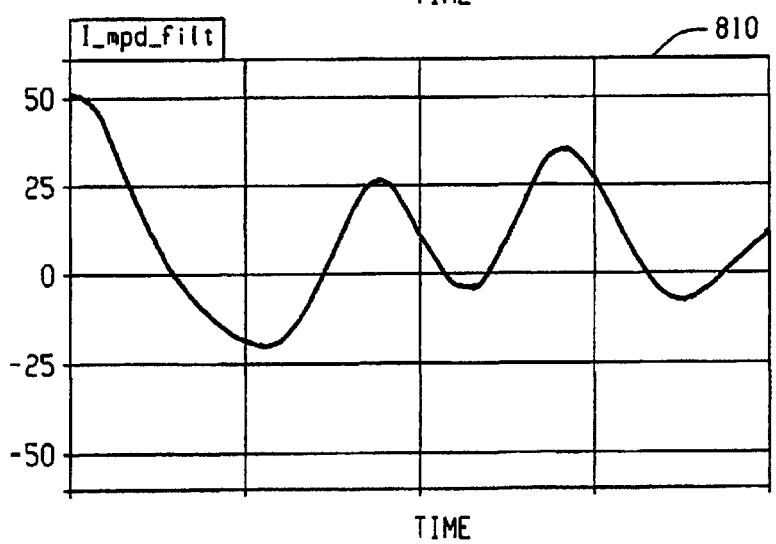
FIG. 8E depicts a filtered version of the $I_{MPD}$ signal.
Figure 8F:
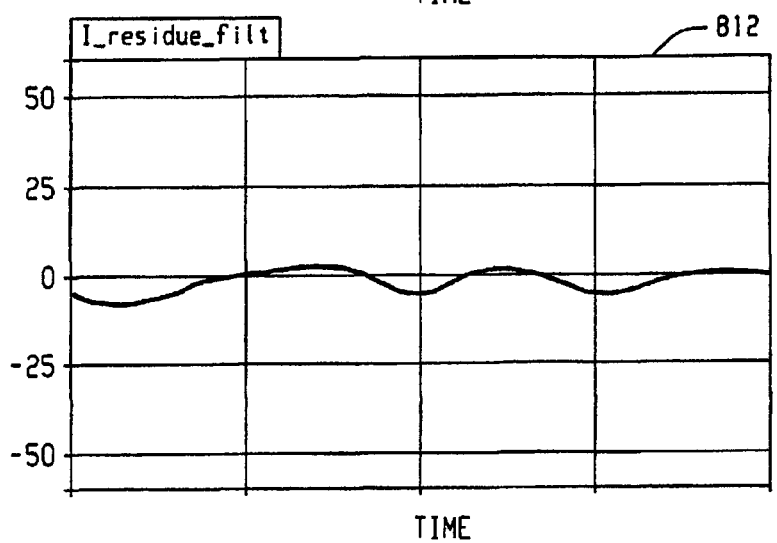
FIG. 8F depicts a filtered version of the $I_{RESIDUE}$ signal.
Figure 8G:
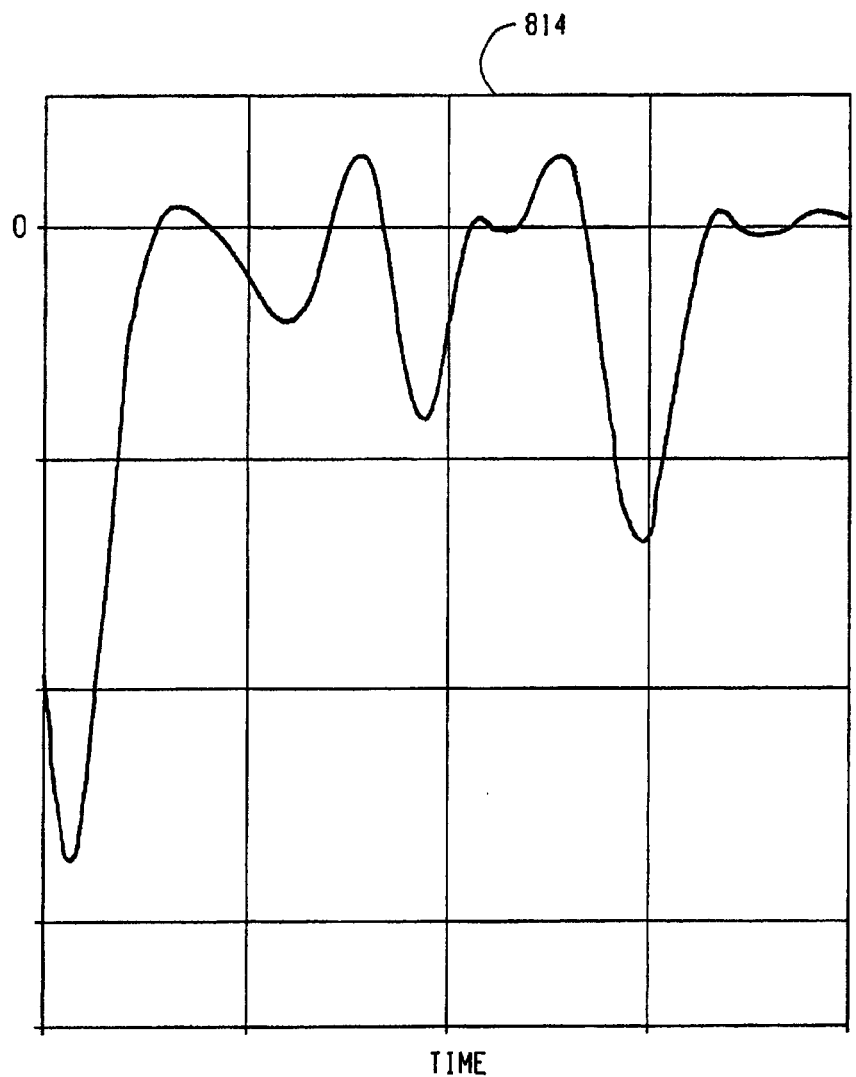
FIG. 8G depicts the $V_{MULT}$ signal.

FIG. 6 is a block diagram of an optical modulation feedback circuit depicting example details of a subtractor circuit. A laser diode driver 602 generates a driver signal 604 based on a data input signal 606 and an optical modulation amplitude current feedback signal 608. The driver signal 604 is transmitted to a laser diode 610 for data transmission. A monitor photo diode 612 acts as an optical detector that generates a monitor current signal 614 (example waveform shown in FIG. 7 at 704) that is proportional to an amount of light generated by the laser diode 610, subject to a limited bandwidth $\omega_{MAX}$. A subtractor 616 subtracts a reference current 618 (example waveform shown in FIG. 7 at 702) that is proportional to the data signal 606 from the monitor current signal 614 to generate a residue current 617 (example waveform shown in FIG. 7 at 706). The reference current 618 is generated as a sum of a logic "0" current 620 and a delta current 622, where the logic "1" component of the reference current 618 is controlled by a switch 624 that is responsive to the data signal 606. The logic "0" current 620 and the logic "1" current may be selected such that when the laser diode 612 is transmitting at the desired OMA, the low frequency component of the residue current 617 will be zero.

The residue current 617 is transmitted to a trans-impedance amplifier 626 to convert the residue current 617 to a residue voltage 628. The residue voltage 628 and the data signal 606 are low-pass filtered and AC-coupled at 630, 631 (example waveforms shown in FIG. 7 at 712, 708, respectively), such as according to or below an actual or estimated bandwidth of the monitoring photo diode 612. At 632, the filtered residue signal and filtered data signal are multiplied (example waveform shown in FIG. 7 at 714) and a DC component or average of the multiplication is detected by an integrator 634 to generate the modulation control feedback signal 608 that is transmitted to the laser diode driver 602.

FIGS. 7 and 8 depict a number of plots of example data signals at particular points in the configuration of FIG. 6. In FIG. 7, the OMA of the transmitter is below the target and should be increased accordingly. The plot at 702 represents the $I_{REF}$ signal, which is generated and proportional to the data signal. The $I_{MON0}$ and $I_{MON1}$ magnitudes are selected such that when the optical transmission device is operating at the desired OMA, the low frequency component of the $I_{RESIDUE}$ signal will be zero. The plot at 704 indicates the monitor current signal generated by the monitor photo diode, and the plot at 706 represents the $I_{RESIDUE}$ signal generated by subtracting $I_{REF}$ from $I_{MPD}$. The plots at 708, 710, and 712 represent low pass filtered versions of $I_{REF}$, $I_{MPD}$, and $I_{RESIDUE}$, respectively. At 714, a filtered data signal (e.g., a voltage-form of $I_{REF}$) is multiplied by the filtered residue signal (e.g., a voltage form of $I_{RESIDUE}$) to generate the $V_{MULT}$ signal used to generate the modulation control feedback signal. Because the $V_{MULT}$ signal averages greater than zero, the laser diode driver is instructed to raise the OMA via the data signal proportionally.

In FIG. 8, the OMA of the transmitter is above the target and should be decreased accordingly. The plot at 802 represents the $I_{REF}$ signal, which is generated and proportional to the data signal. The plot at 804 indicates the monitor current signal generated by the monitor photo diode, and the plot at 806 represents the $I_{RESIDUE}$ signal generated by subtracting $I_{REF}$ from $I_{MPD}$. The plots at 808, 810, and 812 represent low pass filtered versions of $I_{REF}$, $I_{MPD}$, and $I_{RESIDUE}$, respectively. At 814, a filtered data signal (e.g., a voltage-form of $I_{REF}$) is multiplied by the filtered residue signal (e.g., a voltage form of $I_{RESIDUE}$) to generate the $V_{MULT}$ signal used to generate the modulation control feedback signal. Because the $V_{MULT}$ signal averages less than zero, the laser diode driver is instructed to lower the OMA via the data signal proportionally.

Figure 9:
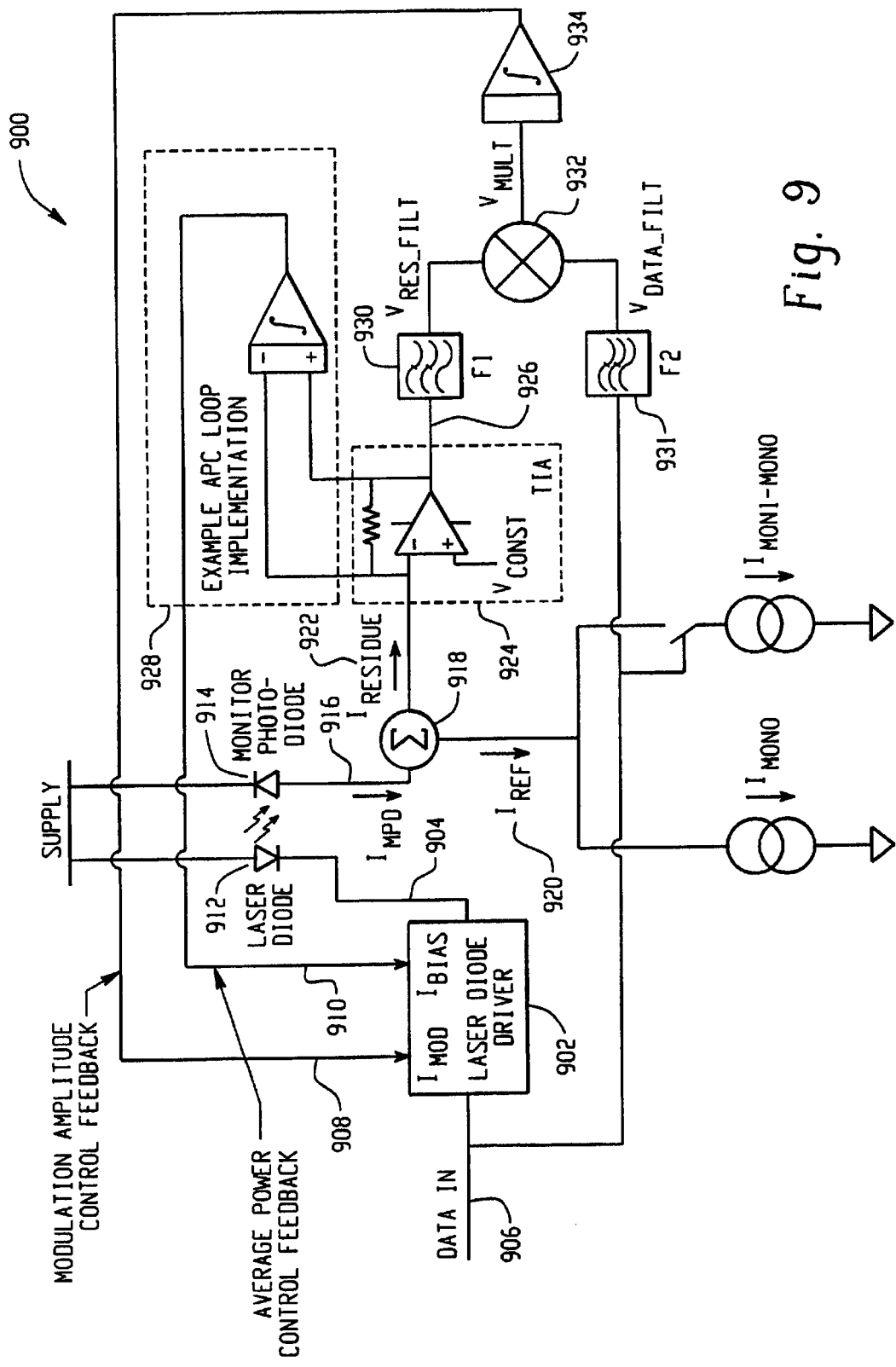
FIG. 9 is a block diagram of an optical modulation feedback circuit including average power control.

In some implementations, it is desirable to also incorporate average power control (APC) feedback into the optical transmitter. FIG. 9 is a block diagram of an example of an optical modulation feedback circuit including average power control. A laser diode driver 902 generates a driver signal 904 based on a data input signal 906, an optical modulation amplitude current feedback signal 908, and an bias current control signal 910. The driver signal 904 is transmitted to a laser diode 912 for data transmission. A monitor photo diode 914 acts as an optical detector that generates a monitor current signal 916 that is proportional to an amount of light generated by the laser diode 912. A subtractor 918 subtracts a reference current 920 that is proportional to the data signal 906 from the monitor current signal 916 to generate a residue current 922.

The residue current 922 is transmitted to a trans-impedance amplifier 924 to convert the residue current 922 to a residue voltage 926. The trans-impedance amplifier 924 may filter a DC component from the $I_{RESIDUE}$ signal and provide that DC component to an APC control loop 928. The APC control loop 928 generates the bias current control signal 910 based on the DC component of the $I_{RESIDUE}$ signal to force the DC component of the monitor current signal to a desired level. The residue voltage 926 and the data signal 906 are low-pass filtered at 930, 931, such as according to or lower than the actual or estimated bandwidth of the monitoring photo diode 914. At 932, the filtered residue signal and filtered data signal are multiplied or correlated and transmitted to an integrator 934 to generate the modulation control feedback signal 908 that is transmitted to the laser diode driver 902.

Figure 10:
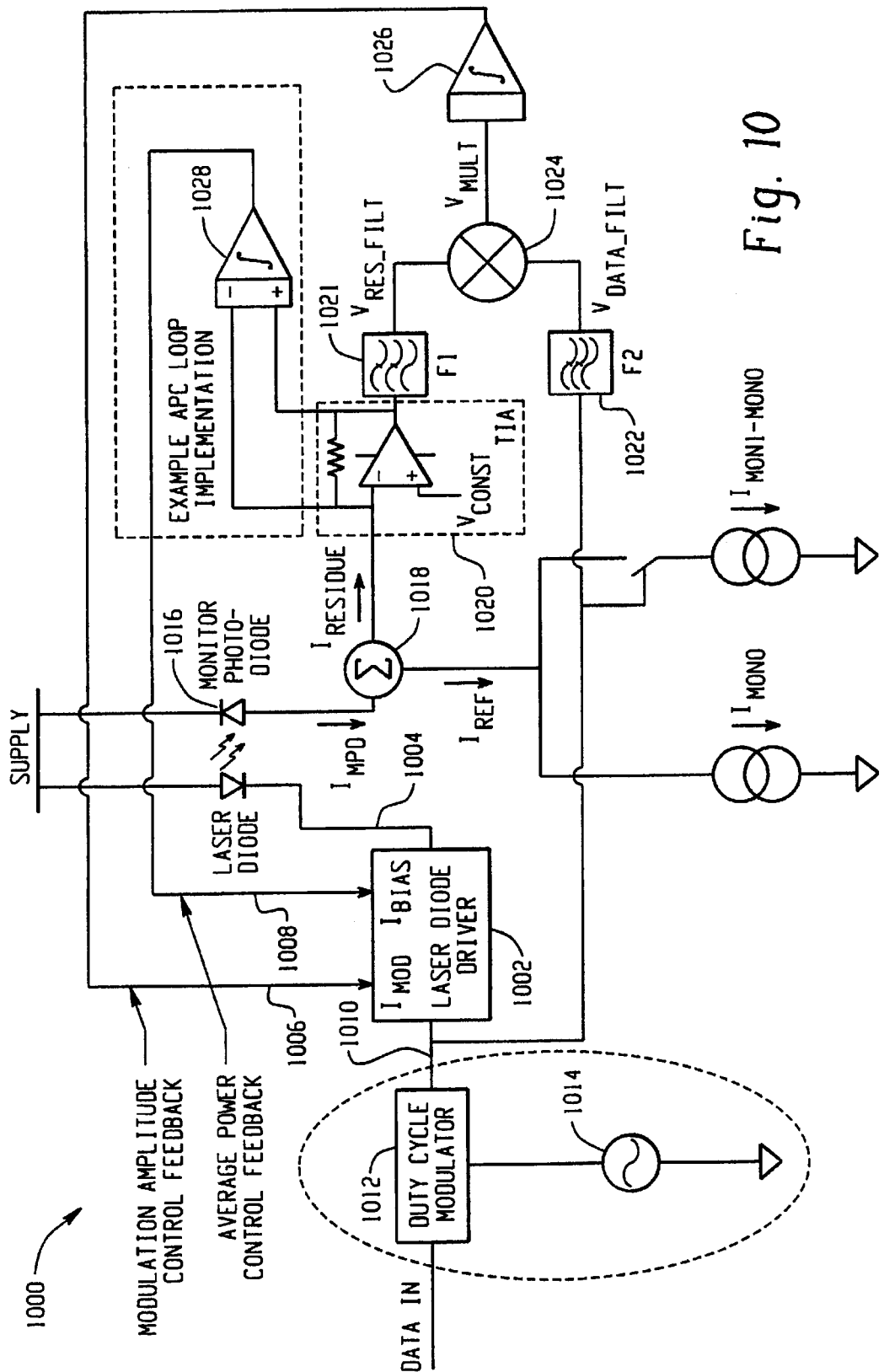
FIG. 10 is a block diagram depicting an optical transmitter that includes a duty cycle modulator.

In some scenarios, such as when the input data is relatively static with a repeating short sequence with a fast repetition rate, the low frequency component of the data signal may be insufficient for identifying deviations of the transmitter OMA from the desired OMA. To ensure a sufficient low frequency component of the data signal, a duty cycle modulator may be incorporated into the optical transmitter. FIG. 10 depicts an optical transmitter that includes a duty cycle modulator. A laser diode driver 1002 transmits a driver signal 1004 based on a modulation current control signal 1006, an bias current control signal 1008, and a data input signal 1010 having a duty cycle that is modulated by a duty cycle modulator 1012 according to a low frequency test signal 1014, where the data signal 1010 is produced by differentially delaying the rising and falling edges of the data signal according to the low frequency test signal 1014 (e.g., a pseudo-random bit sequence). The amount of duty cycle distortion introduced by the duty cycle modulator 1012 may be limited such as to have a negligible effect on total jitter of the optical link.

The duty cycle modulated data signal 1010 and a monitor signal from the optical modulator 1016 are provided to a subtractor 1018, trans-impedance amplifier 1020, filters 1021, 1022, multiplier 1024, and integrators 1026, 1028 to generate the modulation current control signal 1006 and bias current control signal 1008. Where implementations lacking the duty cycle modulator 1012 may struggle in identifying OMA errors due to a small low frequency component of the input data signal 1010, the configuration of FIG. 10 can provide strong OMA control despite long periods of repetitive data (e.g., an idling pattern such as 10101010 . . . ).

The duty cycle modulation may be selectively activated based on a monitoring of the input data signal. For example, when the data signal is observed to be static (e.g., a repetitive idling pattern), duty cycle modulation may be activated so as to emphasize the low frequency component of the data signal. When the data signal is dynamic, such that a low frequency component is sufficient based on the data signal waveform alone, duty cycle modulation can be disabled.

Figure 11:
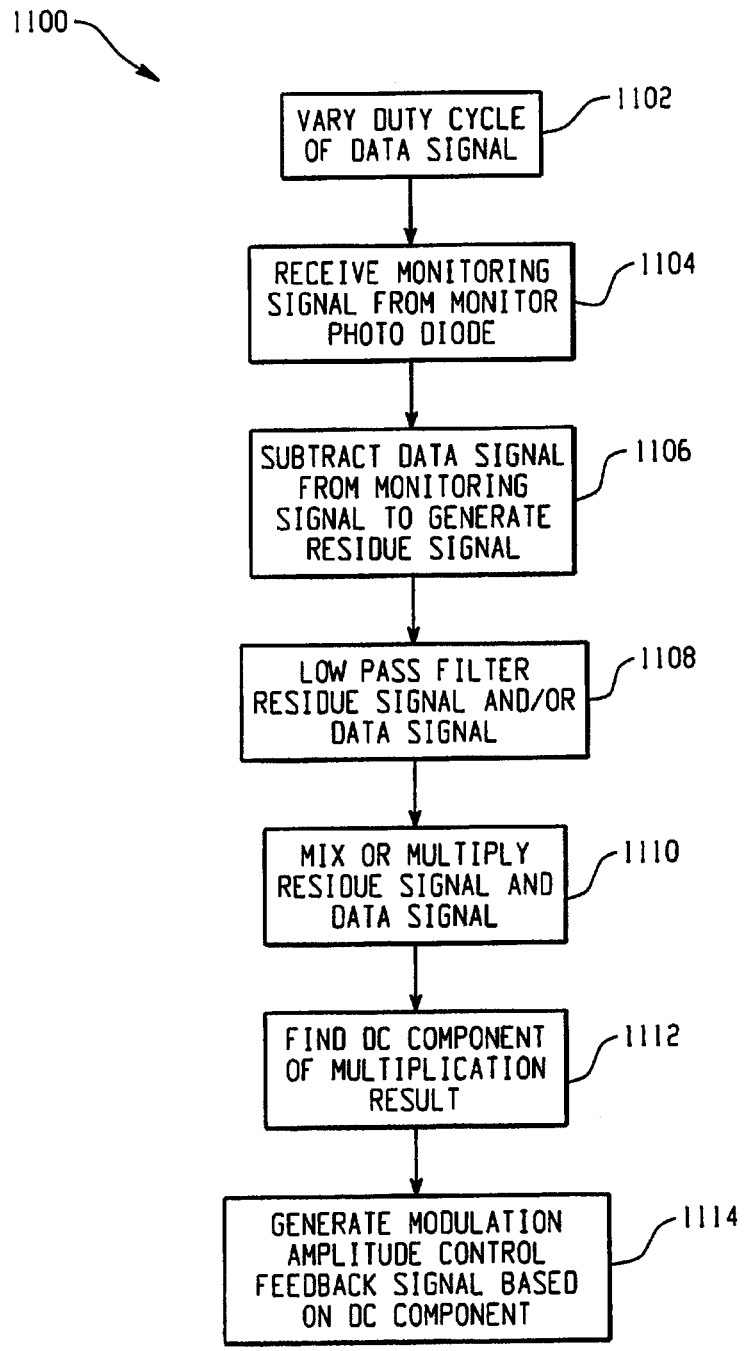
FIG. 11 is a flow diagram depicting a method of performing optical modulation amplitude feedback control including duty cycle modulation.

FIG. 11 is a flow diagram depicting a method of performing optical modulation amplitude feedback control including duty cycle modulation. At 1102, a duty cycle of a received data signal is varied to add to a low frequency component of the data signal. At 1104, a monitoring signal is received from an optical detector that is proportional to an amount of light generated by an optical transmission device that transmits based on the modulated data signal. At 1106, a signal proportional to the modulated data signal is subtracted from the monitoring signal to generate a residue signal. At 1108, one or both of the residue signal and the modulated data signal are low pass filtered, and at 1110, the (filtered) residue signal and data signal are correlated or multiplied to generate a modulation current control signal at 1112.

Figure 12:
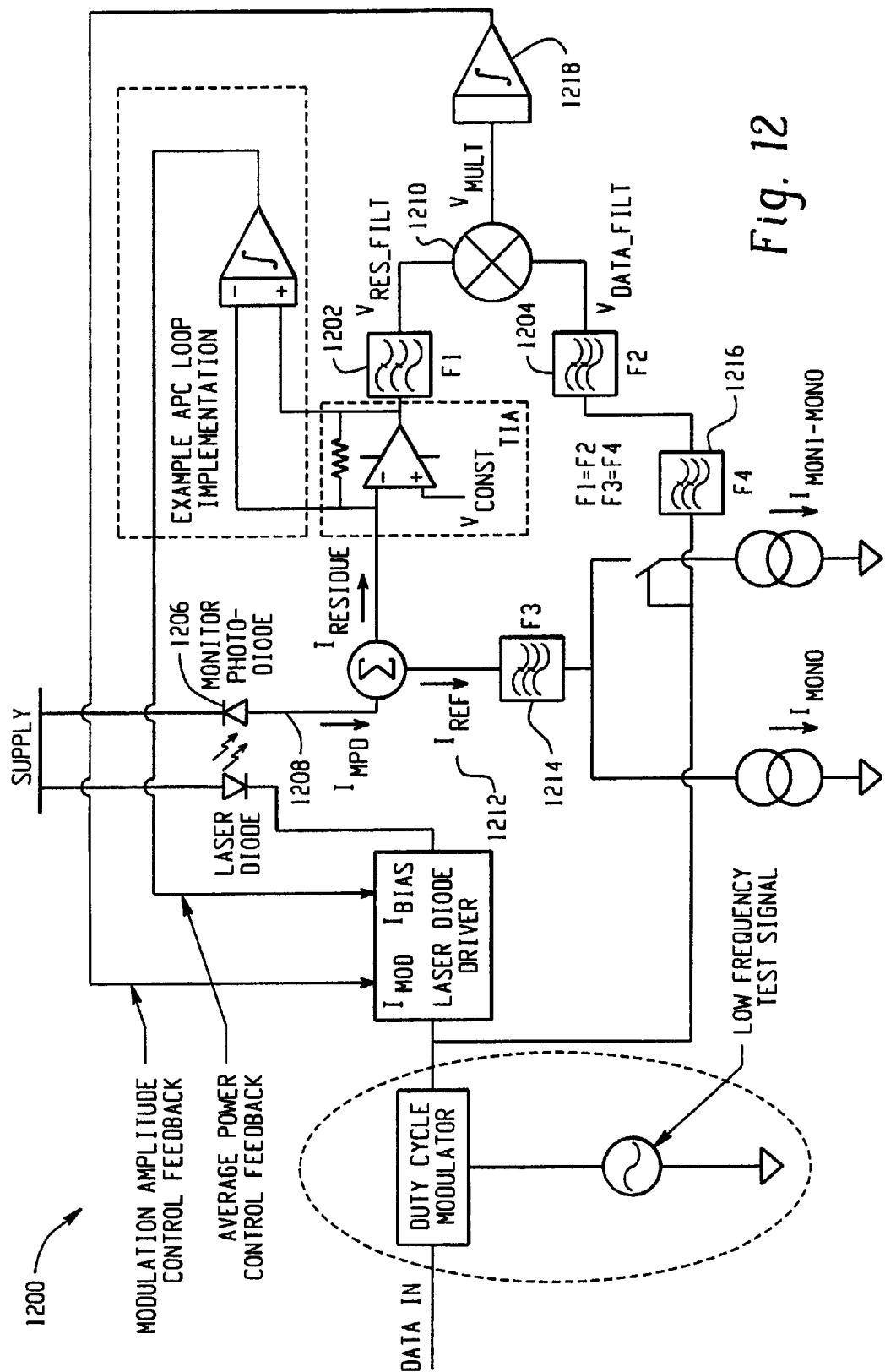
FIG. 12 depicts an example optical transmitter configuration that includes additional filtering of the circuit signals.

The previous configurations are exemplary, and the scope of this disclosure encompasses additional variations not explicitly described above. For example, FIG. 12 depicts an example optical transmitter configuration that includes additional filtering of the circuit signals. In the example of FIG. 12, upper cutoff frequencies of filter F1 1202 and F2 1204 are selected to be lower than the monitoring photo diode 1206 signal to a frequency range that can be accurately detected by the monitor photo diode 1206. Setting excessively high cutoff frequencies at 1202, 1204 can reduce an apparent amplitude of the monitor signal 1208 because the comparison at 1210 includes some frequency components that are attenuated by the monitor photo diode 1206. This apparent attenuation may be exacerbated by an increasing phase shift of the monitor photo diode signal 1208 at frequencies approaching the monitor photo diode 1206 bandwidth limit, reducing a correlation between the data signal and the in-phase component of the monitor photo diode signal 1208.

Filtering the reference signal $I_{REF}$ 1212 prior to subtraction can improve the correlation determination. Low-pass filter F3 1214 compensates to some extent for the limited bandwidth of the monitor photo diode 1206. Filter F4 1216 introduces a matching phase shift to the data signal that is used by the correlator, comprising multiplier 1210 and integrator 1218. When F3 1214 matches the frequency response of the monitor photo diode 1206, then $I_{RESIDUE}$ will be zero when OMA is on target. While the monitor photo diode 1206 bandwidth is typically not known with great accuracy, the inclusion of filters F3 1214 and F4 1216 allows the system to tolerate a wider range of monitor photo diode 1206 bandwidth while maintaining accuracy of amplitude control.

For example, if monitor photo diode 1206 bandwidth is higher than F3 1212 bandwidth, then the amplitude of the monitor photo diode signal 1208 will exceed that of the reference signal at frequencies approaching F3 1214 bandwidth. This might be expected to cause the system to overestimate the current OMA. However, at such frequencies, there is also increasing phase difference between the monitoring signal 1208 and the reference signal 1212, due to the increasing phase shift introduced by filter F3 1212. This, again, reduces the correlation between the (similarly filtered) data signal and the in-phase component of the monitor photo diode signal 1208. Therefore, the phase difference tends to compensate, to some extent, for the amplitude difference. This is in contrast to the other situations, where the phase difference may reinforce the amplitude difference.

Therefore, F3 1214 can be set quite aggressively to compensate for a low monitor photo diode 1206 bandwidth, without significantly affecting the accuracy if the monitor photo diode 1206 bandwidth is higher than expected. For a given bandwidth of F1 1202 and F2 1204 (which set the bandwidth of the amplitude comparison), the system can tolerate a much wider range of monitor photo diode 1206 bandwidths; and/or for a given lower limit of monitor photo diode 1206 bandwidth, the bandwidth of F1 1202 and F2 1204 can be increased, allowing the amplitude comparison to be made over a wider frequency band. The latter allows a much greater proportion of the data signal energy to be used in the comparison. This reduces sensitivity to noise and offsets and allows the detection of OMA error to be made over a much shorter time window. This may be useful for burst mode optical drivers, where data may be transmitted in short bursts.

Figure 13:
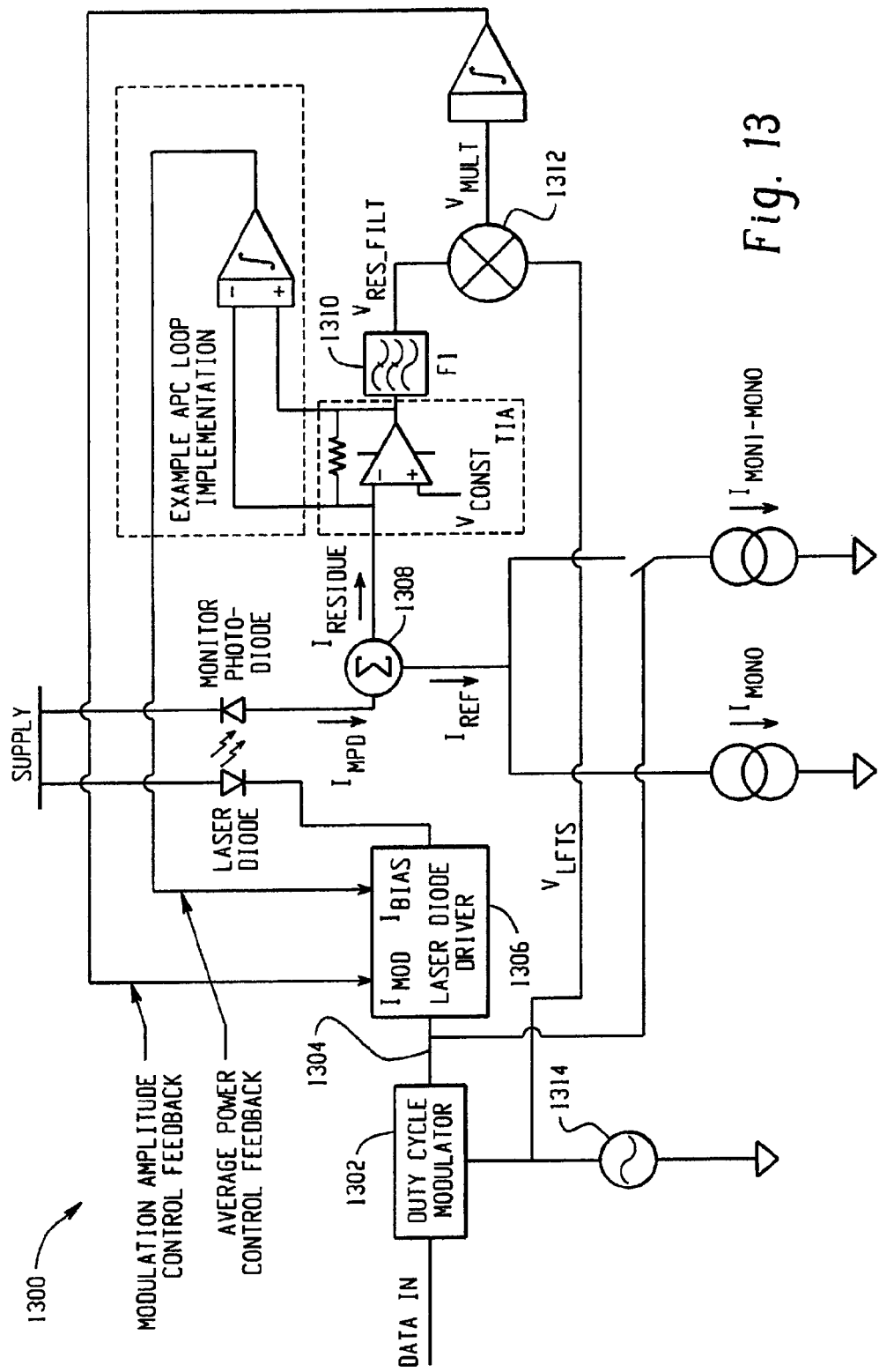
FIG. 13 is a block diagram depicting an alternate data signal duty cycle modulation configuration.
Figure 14:
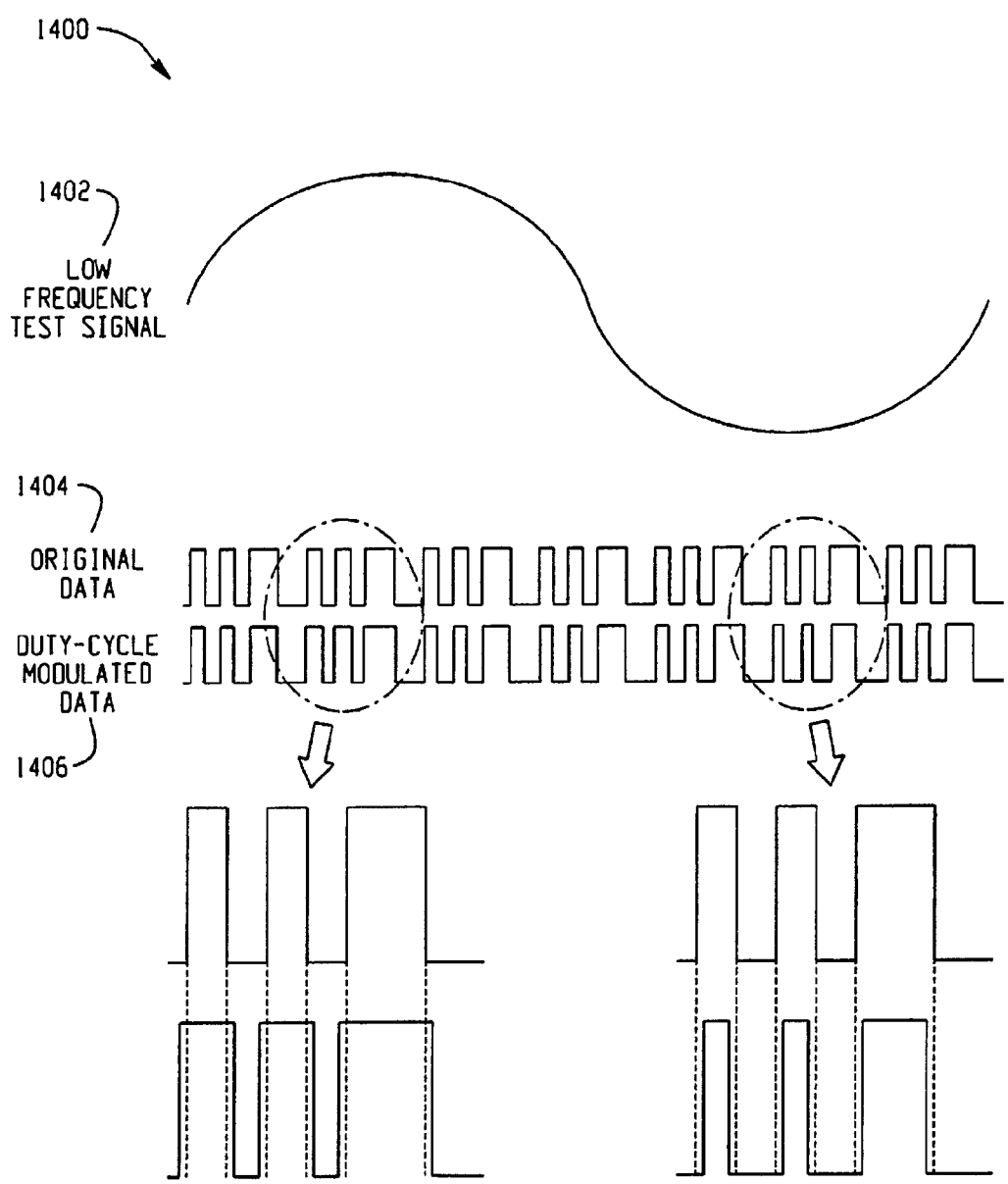
FIG. 14 depicts an example low frequency test signal and the effect of that test signal on the data signals.

As another example, FIG. 13 is a block diagram depicting an alternate data signal duty cycle modulation configuration. A duty cycle modulator 1302 varies the duty cycle of an input data signal to generate a modulated input data signal 1304 that is transmitted to the laser diode driver 1306. Unlike previously described examples, instead of providing the data signal 1304 to the multiplier/mixer 1312, the low frequency test signal 1314 is instead provided as the input to 1312. In scenarios where a large portion of the low frequency component of the data signal 1304 is provided by the duty cycle modulation, direct usage of the low frequency test signal 1314 can provide improved OMA control. FIG. 14 depicts an example low frequency test signal 1402 and the effect of that test signal on the data signals 1404.

Figure 15:
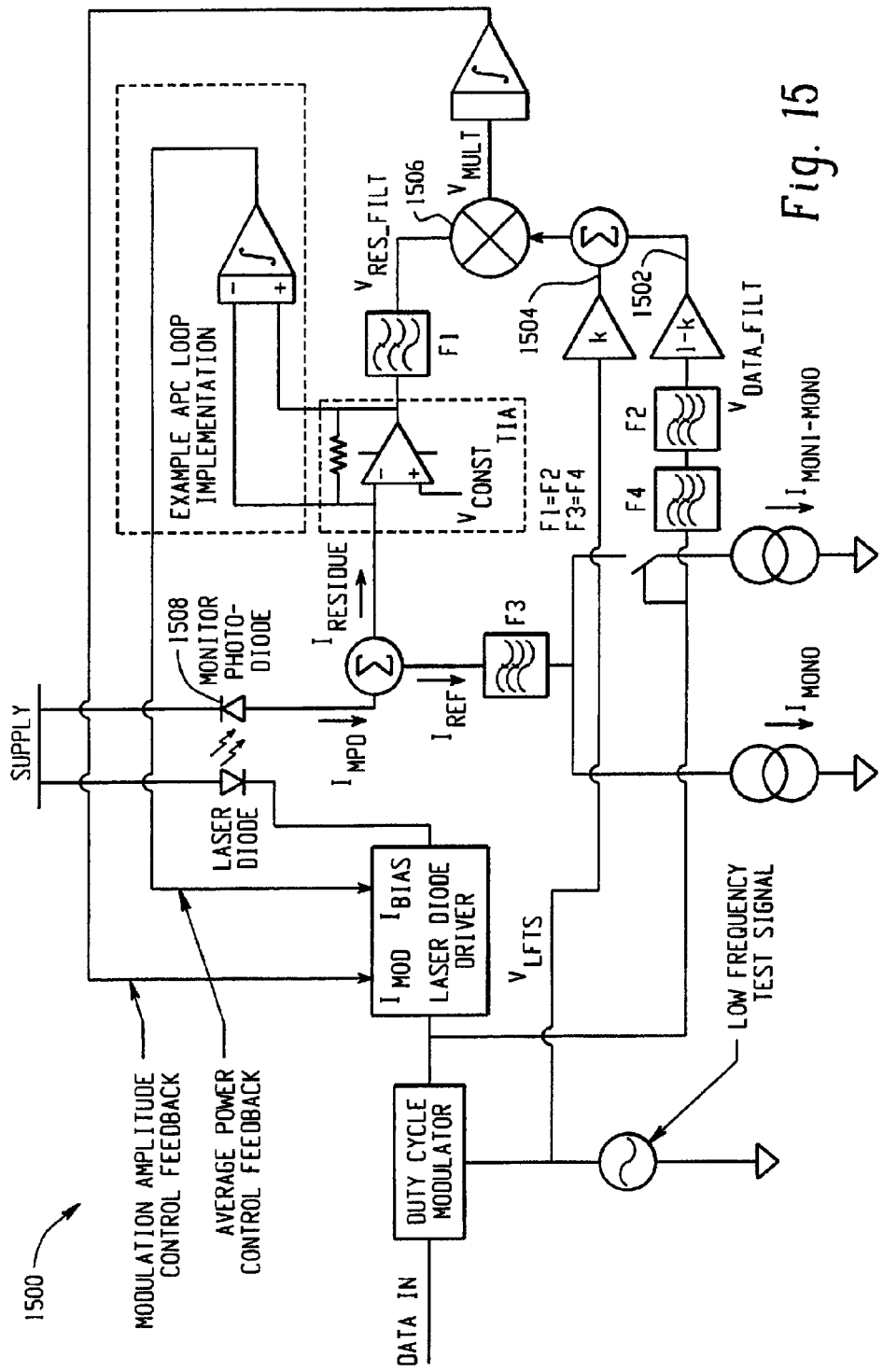
FIG. 15 depicts a hybrid architecture.

As a further example, FIG. 15 depicts a hybrid architecture. The hybrid architecture combines certain features described herein above. In the example of FIG. 15, both VDATA_FILT 1502 and VLFTS 1504 are provided to the correlator 1506. The architecture of FIG. 15 may provide quality OMA control that is irrespective of the amount of low-frequency content in the input data signal.

Certain of the embodiments described herein can provide excellent immunity to non-linearity, kinks, and bumps in the L-I curve and may avoid any necessity for detailed characterization of the laser. The depicted architecture may be implemented with a moderate or low bandwidth monitor photodiode, may exhibit low power consumption, and may be utilized in systems having very high (theoretically unlimited) bit rates.

It is noted that the optical modulation amplitude control systems can be provided in a variety of configurations. For example, an optical modulation feedback circuit can be implemented in a standalone fashion that includes a low frequency comparison circuit that generates a modulation control feedback signal. In another configuration, an optical driver integrated circuit can include an optical driver and a low frequency comparison circuit. In a further configuration, an optical module can include an optical driver, a laser diode, an optical detector, and a low frequency comparison circuit. Additionally, certain elements may use digital components instead of the analog versions depicted herein.

Figure 16:
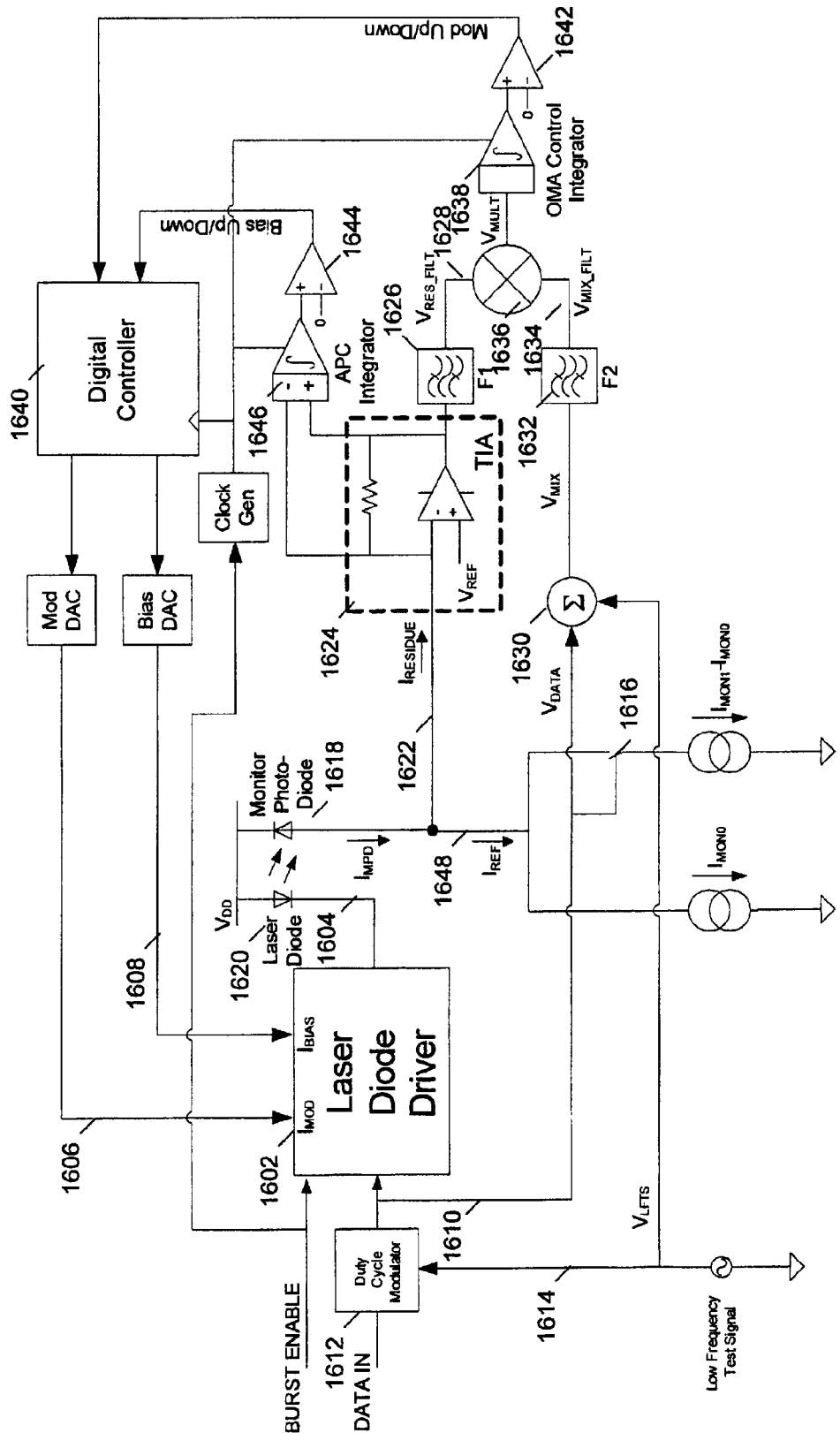
FIG. 16 is a block diagram depicting another example configuration depicting an optical modulation feedback system that includes a digital controller.

The invention has been described with reference to particular exemplary embodiments. However, it will be readily apparent to those skilled in the art that it is possible to embody the invention in specific forms other than those of the exemplary embodiments described above. For example, FIG. 16 is a block diagram depicting another example configuration depicting an optical modulation feedback system that includes a digital controller. A laser diode driver 1602 transmits a driver signal 1604 based on a modulation current control signal 1606, a bias current control signal 1608, and a data input signal 1610 having a duty cycle that is modulated by a duty cycle modulator 1612 according to a low frequency test signal 1614, where the data signal 1610 is produced by differentially delaying the rising and falling edges of the data signal according to the low frequency test signal 1614 (e.g., a pseudo-random bit sequence). The control inputs 1606, 1608, 1610 may take a variety of forms. In one example, the bias current control signal 1608 is representative of a laser current during transmission of a logic-0 level. When using such a definition, the average laser current will be $I_{BIAS}+I_{MOD}/2$ (assuming a 50% average duty cycle of the data signal). In such a configuration, the average optical power output is affected by both $I_{BIAS}$ and $I_{MOD}$, which could result in unwanted interference between the average power control and OMA control loops. To address this potential issue, in some configurations $I_{BIAS}$ is defined as the average of the laser logic-0 and logic-1 drive currents. In such an implementation, the laser driver 1602 can be configured to calculate the logic-0 drive current using the formula: Logic-0 laser drive current=$I_{BIAS}$–$I_{MOD}$/2. In such an implementation, variation of $I_{MOD}$ by the OMA control loop has no effect on average optical power, allowing the average power control loop and the OMA control loop to operate independently.

The duty cycle modulated data signal 1610 is used to control a switch 1616 that facilitates subtraction of a signal proportional to the data signal 1610 from a monitoring signal output by the monitor photo diode 1618 that monitors the output of the laser diode 1620 driven by the driver signal 1604. The subtraction generates a residue signal 1622 used downstream. A transimpedance amplifier 1624 converts the residue signal 1622 from a current to a voltage, where a DC component of that voltage is extracted using the APC integrator 1646, where the DC component is used for maintaining a desired average power. The residue signal 1622 is then filtered at 1626 by a low pass or band pass filter, such as to remove high frequency and DC components of the residue signal 1622, to generate a filtered residue signal 1628 for comparison. The filtered residue signal is compared to a signal that is mixed at 1630, pre-filter F2 in contrast to post-filter F2 in FIG. 15, using the duty cycled modulated data signal 1610 and the low frequency test signal 1614. Those two signals 1610, 1614 are summed (e.g., via a weighted mixing) at 1630 and provided to a low pass or band pass filter at 1632, that may be matched to the filter at 1626, to generate a filtered, mixed signal 1634. In some implementations the residue signal 1622 and the signal from the mixer at 1630 may be provided to the exact same number of filters 1626, 1632 in an attempt to best maintain the phase between the signals 1628, 1634 outputted from those filters 1626, 1632, as each filtering of a signal may cause a phase shift to the filtered signal. By filtering both signals by the exact same n number of filters, the phases at 1628, 1634 may be best maintained. At 1636, the signals 1628, 1634 are compared such as by multiplying the two signals 1628, 1634 in order to detect correlation or inverse correlation between the two signals, which would produce a positive or negative average in the multiplication result, and the results of that comparison are integrated at 1638.

A digital controller 1640 is used in the example of FIG. 16 in generating the modulation current control signal 1606 and the bias current control signal 1608. In the example of FIG. 16, the digital controller 1640 provides the modulation current control signal 1606 and the bias current control signal 1608 based on inputs from comparators 1642, 1644, respectively, where comparator 1642 receives input from the OMA control integrator 1638 and comparator 1644 receives input from an APC integrator 1646 in order to detect the sign of each integration result (i.e., whether the input to the integrator has a positive or negative average value).

Figure 17:
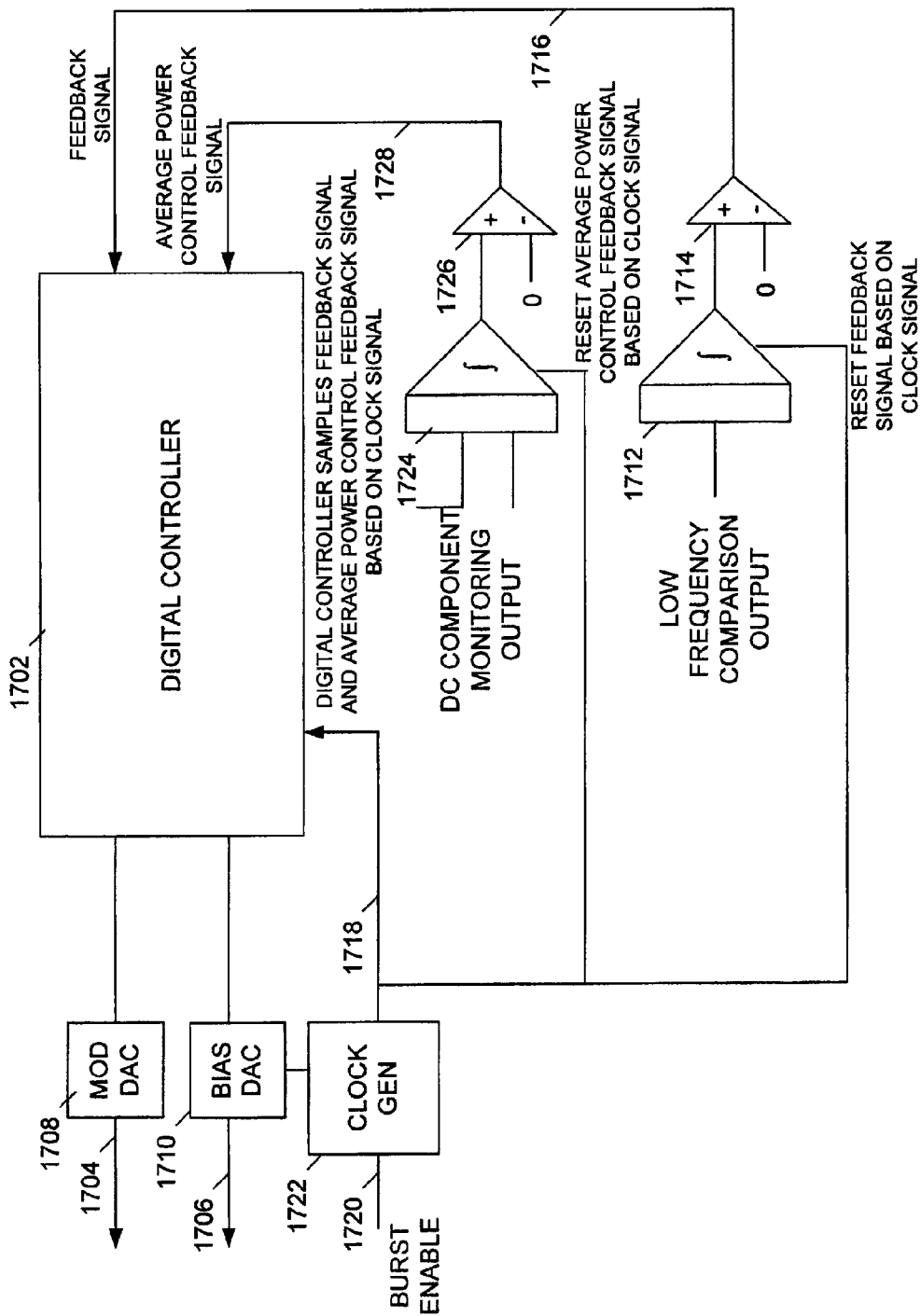
FIG. 17 is a block diagram depicting a close up of example inputs and outputs of the digital controller.

FIG. 17 is a block diagram depicting a close up of example inputs and outputs of the digital controller. The digital controller 1702 provides the modulation current control signal 1704 and the bias current control signal 1706 as outputs to the laser diode driver, subject to respective digital to analog conversions at 1708, 1710. The digital controller 1702 provides these outputs 1704, 1706 based on prior states of those outputs and inputs received from the feedback loops. For example, with respect to the OMA control feedback loop, the low frequency component of the monitoring signal and the low frequency component of the data signal are multiplied (e.g., at 1636 of FIG. 16), and the result of the multiplication is integrated at 1712. The result of that integration at 1712 is provided to a comparator 1714, which determines whether the integration result is positive or negative. The binary up or down feedback signal 1716 from the comparator 1714 is used by the digital controller 1702 to adjust the modulation current control signal 1704 up or down from its current level.

In operation, the digital controller 1702 and the OMA loop integrator 1712 are responsive to a clock signal 1718. The clock signal 1718 is provided to the digital controller 1702 and the integrator 1712 when the optical transmitter is active, such as during transmission. Based on pulses from the clock signal 1718, such as at the end of every clock cycle, the digital controller 1702 samples the feedback signal 1716 from the OMA loop comparator 1714. Based on the sampled feedback signal, the digital controller 1702 determines whether to adjust the modulation current control signal 1704 up or down one or more levels based on the level of the feedback signal 1716. The OMA loop integrator 1712 also receives the clock signal 1718 and is reset based on the receipt of clock pulses, such as each time a clock pulse is received. The integrator 1712 may be held at a zero value for a short period relative to the clock signal 1718 period to allow for effects of a previous adjustment to the laser diode driver to propagate through the system. In such a configuration where the integrator 1712 is reset by the clock signal 1718, the OMA loop integrator 1712 monitors the low frequency comparison over a single clock cycle to determine whether that comparison is generally positive or negative. That integration result is provided to the OMA loop comparator 1714, which provides a signal (e.g., a binary up or down signal, or an up or down signal plus a magnitude of adjustment) along the OMA loop feedback path 1716, instructing the digital controller on how to adjust the modulation current control signal 1704.

In addition to facilitating the digital adjustments of the modulation current control signal 1704, as described above, the use of the clock signal 1718 in conjunction with the digital controller 1702 can provide benefits in implementations where data transmission is non-continuous. In many non-continuous data transmission schemes, such as asynchronous schemes that transmit data in bursts, certain signal generation parameters must be significantly readjusted on each burst in an attempt to meet channel and other system characteristics. The digital controller 1702 of FIG. 17 can be configured to retain a last state of the output signals 1704, 1706 when the optical transmitter is inactive, as indicated by a dormant clock signal 1718. When the clock signal 1718 is reactivated, such as when a burst enable signal 1720 is provided to a clock generator 1722, the digital controller 1702 outputs the last known states as starting outputs 1704, 1706. If the time period between bursts is relatively short and if operating conditions have not changed significantly since the last burst transmission, then the last known states provided by the digital controller 1702 are likely near desirable inputs to the laser diode driver. During operation with an active clock signal 1718, these output values 1704, 1706 will be further adjusted, such as via the OMA loop feedback signal 1716. In some configurations, when the burst length is shorter than the clock period of the clock signal 1718, then a clock event (e.g., a pulse) may be generated at the end of the burst to ensure that there is always at least one clock cycle per burst to allow for adjustment of the outputs 1704, 1706.

The bias current control signal 1706 can be controlled in a similar way as the modulation current control signal 1704. The DC component of the residue signal (such as from transimpedance amplifier 1624 in FIG. 16) is detected by integrating at 1724, and the result of the integration is provided to a comparator 1726 that determines whether the integration result is positive or negative and provides a binary up or down feedback signal 1728 to the digital controller 1702. The digital controller 1702 samples the average power control feedback signal 1728 based on the clock signal 1718 and adjusts the bias current control signal 1706 up or down from its current state based on the received signal 1728. In some configurations, the average power control integrator 1724 is reset based on the clock signal 1718, such as on each pulse, so that the average power control feedback signal 1728 is based on the DC component of the residue signal since the last clock cycle.

With reference back to FIG. 16, as described above, a residue current 1622 is generated by subtracting a reference current 1648 from the monitoring current generated by the monitor photo diode 1618. The reference current 1648 is controlled by a switch 1616 based on the modulated data signal 1610, where the reference current 1648 is representative of the data signal 1610 being transmitted. In operation in the example of FIG. 16, the reference current 1648 is set at the $I_{MON0}$ level when a logic-0 is being transmitted and at a $I_{MON0}+(I_{MON1}-I_{MON0})=I_{MON1}$ level when a logic-1 is being transmitted. In some implementations, the $I_{MON0}$ and $I_{MON1}$ levels are set based on a received desired average power and a received desired optical modulation amplitude (e.g., from a user interface data entry or from a computer-readable medium). However, in other implementations, it may be more desirable to set values in the system, such as $I_{MON0}$ and $I_{MON1}$, based on the desired average power and a desired extinction ratio (i.e., $P_1/P_0$: the ratio of the logic-1 optical power level to the logic-0 optical power level) instead, as in some situations the extinction ratio may be more intuitive or commonly referred to than the optical modulation amplitude. Assuming that the monitor photo diode responds linearly to optical power, then $I_{MON1}/I_{MON0}=P_1/P_0=$Extinction Ratio.

In one implementation, a user interface is provided that accepts a desired extinction ratio and a desired average power of the optical transmission device. In such an implementation, the reference current 1648 that is representative of the data signal is at a first level $I_{MON0}$ when the data signal represents a logic-0 value, and the reference current 1648 is at a second level $I_{MON1}$ when the data signal represents a logic-1 value. The first level $I_{MON0}$ is determined according to:

$$I_{MON0}=2*I_{AVE}/(ER+1),$$

where $I_{MON0}$ is the first current level, $I_{AVE}$ is a current based on the received desired average power (e.g., the average monitor photo-diode 1618 current to be targeted by the APC loop in order to achieve the desired average optical power output of the laser diode 1620; assuming 50% average duty cycle of the data signal $I_{AVE}=(I_{MON1}-I_{MON0})/2$), and ER is the received desired extinction ratio.

The second level $I_{MON1}$ is further determined according to:

$$(I_{MON1}-I_{MON0})=2*I_{AVE}*(ER-1)/(ER+1),$$

where $(I_{MON1}-I_{MON0})$ is the difference between the first and second current levels. The received desired average power of the optical transmission device and the received desired extinction ratio may come from a variety of sources such as from a computer memory or from a user interface. In one example, a user interface accepts a desired extinction ratio and a desired average power of the optical transmission device as inputs but does not accept a value for a desired optical modulation amplitude.

Figure 18:
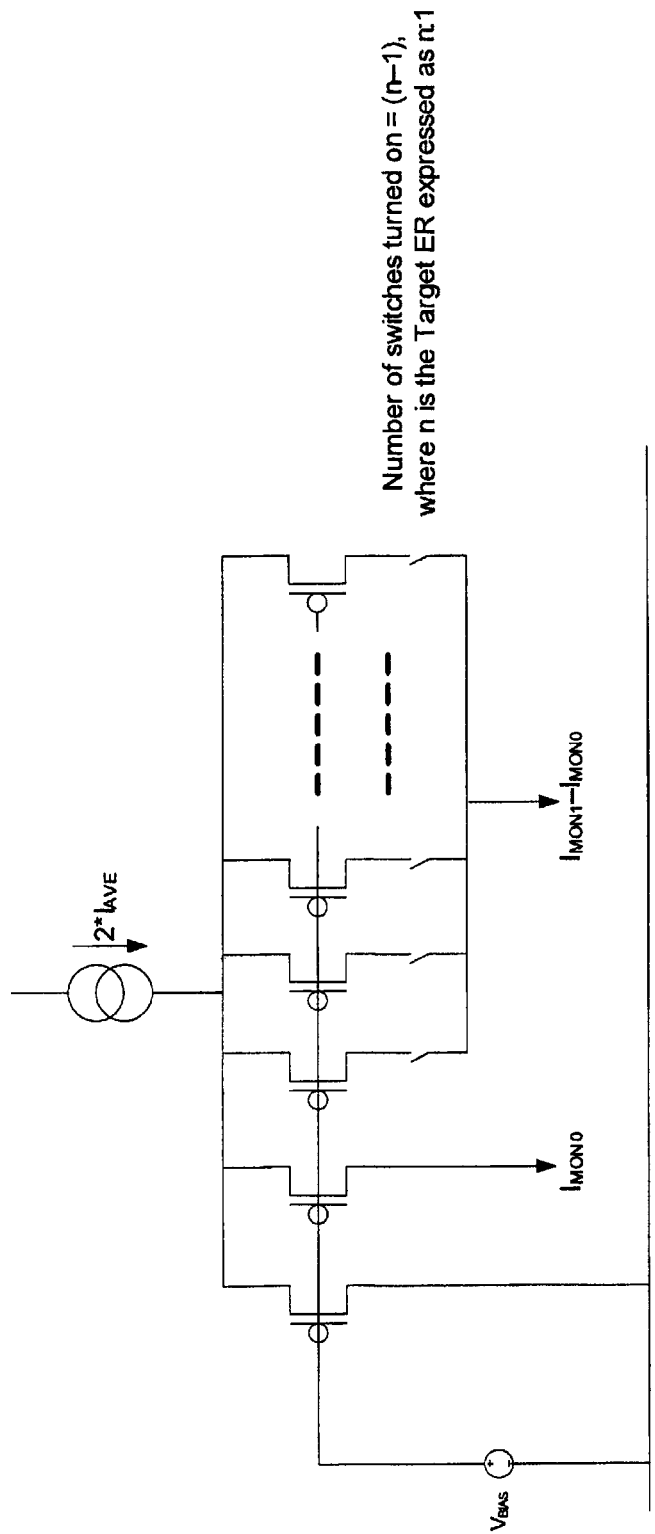
FIG. 18 is a diagram depicting an example mechanism for generating $I_{MON0}$ and $I_{MON1}$.

The currents, $I_{MON0}$ and $(I_{MON1}-I_{MON0})$ depicted in FIG. 16 can be generated via a variety of mechanisms. FIG. 18 is a diagram depicting an example mechanism for generating $I_{MON0}$ and $(I_{MON1}-I_{MON0})$. In FIG. 18, an initial current of $2*I_{AVE}$ is generated based on a desired average power, such as by a digital to analog converter under user control. A number of switches to be turned on is determined based on a desired extinction ratio. In one example, the number of switches turned on is equal to n−1, where n is the target extinction ratio. If all of the depicted gate-connected PMOS transistor devices are equivalent, and (n−1) switches are turned on, then the current is shared equally between a total of (n+1) transistor devices. Thus $I_{MON0}$ is generated as having the current in a single transistor device of $2*I_{AVE}/(n+1)$, and $I_{MON1}-I_{MON0}=I_{MON0}*(n-1)=2*I_{AVE}*(n-1)/(n+1)$.

An OMA control scheme may control the optical amplitude by monitoring a low-frequency component of the transmitted signal, as described herein. Assuming that the optical transmitter has a flat frequency response, such control is sufficient to represent the amplitude of the full bandwidth of the data signal. If the frequency response is not flat, then there may be some offset between the target OMA or target extinction ratio and the actual values when measured with a high bandwidth apparatus. Such an offset can be compensated by a trim control, which adjusts the values of the $I_{MON0}$ and $I_{MON1}$ currents. For example, the value of $(I_{MON1}-I_{MON0})$ can be multiplied by a scaling factor (e.g., a scaling factor greater than or less than 1) according to the trim control setting, and the value of $I_{MON0}$ can be adjusted accordingly to keep the average of $I_{MON1}$ and $M_{MON0}$ constant. Such control can vary the amplitude of the AC component of the $I_{REF}$ signal while maintaining the same DC component, such that $I_{AVE}$, and therefore the average optical power output, is unaffected. In one example, the adjusted currents can be determined based on a scaling factor, m according to:

$$I_{MON0,ADJ}=I_{MON0}-0.5(m-1)(I_{MON1}-I_{MON0}),$$

where $I_{MON0,ADJ}$ is the adjusted first level, $I_{MON0}$ is the pre-adjustment first level, and $(I_{MON1}-I_{MON0})$ is the pre-adjustment difference between the first and second levels; and $$(I_{MON1}-I_{MON0})_{ADJ}=m(I_{MON1}-I_{MON0}),$$

where $(I_{MON1}-I_{MON0})_{ADJ}$ is the adjusted difference between the first and second levels.

The embodiments described are merely illustrative and should not be considered restrictive. The scope of the invention is reflected in the claims, rather than the preceding description, and all variations and equivalents which fall within the range of the claims are intended to be embraced therein. For example, the systems and methods may utilize data signals conveyed via networks (e.g., local area network, wide area network, internet, combinations thereof, etc.), fiber optic medium, modulated carrier waves, wireless networks, etc. for communication with one or more data processing devices. The data signals can carry any or all of the data disclosed herein that is provided to or from a device.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Additionally, use of the term "each" does not necessarily mean "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

What is claimed is:

1. A low frequency AC comparison circuit, comprising: circuitry configured to:
   receive a monitoring signal generated by an optical detector, the monitoring signal being proportional to an amount of light generated by an optical transmission device that transmits based on a data signal that is received by an optical driver;
   generate a low frequency AC component of the monitoring signal without a DC component of the monitoring signal and without signal components of the monitoring signal having a frequency greater than the bandwidth of the optical detector;
   generate a low frequency AC component of the data signal without a DC component of the data signal and without signal components of the data signal having a frequency greater than the bandwidth of the optical detector; and
   generate a modulation current control signal that is transmitted to the optical driver based on a comparison by correlating the low frequency AC component of the monitoring signal and the low frequency AC component of the data signal.

2. The circuit of claim 1, wherein the circuitry comprises a digital controller, wherein the digital controller is configured to:
   receive a feedback signal based on the comparison of the low frequency AC component of the monitoring signal and the low frequency AC component of the data signal; and
   generate the modulation current control signal based on the feedback signal and a prior state of the modulation current control signal.

3. The circuit of claim 2, wherein the feedback signal is based on the comparison of the low frequency AC component of the monitoring signal and the low frequency AC component of the data signal over a single clock period.

4. The circuit of claim 3, wherein the feedback signal is a binary up or down signal.

5. The circuit of claim 3, wherein the feedback signal is based on an integration of the comparison over the single clock period.

6. The circuit of claim 5, wherein the integration is performed by an integrator, wherein the integrator and the digital controller are responsive to a clock signal, and wherein the clock signal is active when the optical transmission device is active.

7. The circuit of claim 6, wherein the integrator is reset based on received pulses of the clock signal, and wherein the digital controller samples the feedback signal based on received pulses of the clock signal.

8. The circuit of claim 6, wherein the digital controller retains the prior state of the modulation current control signal when the optical transmission is inactive as indicated by an inactive clock signal.

9. The circuit of claim 2, wherein the digital controller is configured to generate a digital version of the modulation current control signal and to convert the digital version to an analog version of the modulation current control signal.

10. The circuit of claim 2, wherein the digital controller is further configured to:
    receive an average power feedback signal based on a DC component of the monitoring signal; and
    generate a bias current control signal that is transmitted to the optical driver based on the average power feedback signal and a prior state of the bias current control signal.

11. The circuit of claim 10, wherein the bias current control signal is representative of a desired average of a logic 0 drive current and a logic 1 drive current.

12. The circuit of claim 10, wherein the bias current control signal is based on a monitoring of the DC component of the monitoring signal over a single clock period;
    wherein the average power control feedback signal is a binary up or down signal; and
    wherein the average power feedback signal is based on an integration over the single clock period that is based on the DC component of the monitoring signal.

13. The circuit of claim 1, wherein a bandwidth of the low frequency AC component of the data signal is lower than a bandwidth of the optical detector.

14. The circuit of claim 1, wherein a signal representative of the data signal is subtracted from the monitoring signal;
    wherein the signal representative of the data signal is based on a received desired extinction ratio and a received desired average power of the optical transmission device.

15. The circuit of claim 14, wherein the signal representative of the data signal is at a first level when the data signal represents a 0 value, and wherein the signal representative of the data signal is at a second level when the data signal represents a 1 value.

16. The circuit of claim 15, wherein the first level is a first current level determined according to:

$$I_{MON0}=2*I_{AVE}/(ER+1),$$

where $I_{MON0}$ is the first current level, $I_{AVE}$ is a current based on the received desired average power, and ER is the received desired extinction ratio;
    wherein the second level is a second current level determined according to:

$$(I_{MON1}-I_{MON0})=2*I_{AVE}*(ER-1)/(ER+1),$$

where $(I_{MON1}-I_{MON0})$ is the difference between the first and second levels.

17. The circuit of claim 16, wherein the first current level and the second current level are generated using a plurality of gate connected transistors, wherein certain of the transistors are controlled by individual switches.

18. The circuit of claim 14, wherein the desired average power and the desired extinction ratio are received from a memory or via a computer user interface.

19. The circuit of claim 18, wherein the computer user interface does not accept a value for a desired optical modulation amplitude.

20. The circuit of claim 1, wherein a signal representative of the data signal is subtracted from the monitoring signal;
    wherein the signal representative of the data signal is at a first level when the data signal represents a 0 value, and wherein the signal representative of the data signal is at a second level when the data signal represents a 1 value;
    wherein the first level and the second level are adjusted both adjusted based on a scaling factor m.

21. The circuit of claim 20, wherein the first level is adjusted according to:

$$I_{MON0,ADJ}=I_{MON0}-0.5(m-1)(I_{MON1}-I_{MON0}),$$

where $I_{MON0,ADJ}$ is the adjusted first level, $I_{MON0}$ is the pre-adjustment first level, and $(I_{MON1}-I_{MON0})$ is the pre-adjustment difference between the first and second levels;
    wherein the second level is adjusted according to:

$$(I_{MON1}-I_{MON0})_{ADJ}=m(I_{MON1}-I_{MON0}),$$

where $(I_{MON1}-I_{MON0})_{ADJ}$ is the adjusted difference between the first and second levels.

22. The circuit of claim 1, wherein the circuitry is further configured to subtract a signal proportional to the data signal from the monitoring signal to generate a residue signal, wherein the modulation current control signal is based on a correlation of the residue signal and the data signal.

23. The circuit of claim 22, wherein the circuitry is further configured to provide one or both of the residue signal and the data signal to a low pass filter prior to generating the modulation current control signal.

24. The circuit of claim 22, wherein a low frequency AC component of the residue signal is zero when a desired optical modulation amplitude of the optical transmission device is achieved.

25. The circuit of claim 22, further comprising an integrator or low pass filter, wherein the integrator or low pass filter is configured to receive the correlation of the residue signal and the data signal and to generate the modulation current control signal.

26. The circuit of claim 1, further comprising an average power control circuit configured to transmit an average power control signal to the optical driver based on a DC component of the monitoring signal.

27. The circuit of claim 1, wherein the optical transmission device is an LED, a laser diode, or a VCSEL.

28. The circuit of claim 1, wherein the modulation current control signal is transmitted to the optical driver to adjust a modulation amplitude of the optical driver.

29. The circuit of claim 1, wherein a duty cycle of the data signal is dynamically varied according to a low frequency AC test signal to introduce additional low frequency AC content into the data signal.

30. The circuit of claim 29, wherein the data signal is mixed with the low frequency test signal to generate a mixed correlation signal;
wherein the comparison circuit is configured to subtract a signal proportional to the data signal from the monitoring signal to generate a residue signal; and
wherein the modulation current control signal is generated based on a correlation of the residue signal and the mixed correlation signal.

31. The circuit of claim 30, wherein the residue signal is transmitted to a filter to generate a filtered residue signal;
wherein the mixed correlation signal is transmitted to a substantially identical filter to generate a filtered mixed correlation signal;
wherein the modulation current control signal is generated based on a correlation of the filtered residue signal and the filtered mixed correlation signal.

32. An optical module, comprising:
an optical driver configured to output a driver signal based on a received data signal, wherein a modulation amplitude of the driver signal is controlled according to a received modulation current control signal;
a laser diode configured to transmit light based on the driver signal;
an optical detector configured to generate a monitoring signal that is proportional to an amount of light generated by an optical transmission device; and
a low frequency AC comparison circuit, comprising circuitry configured to:
receive the monitoring signal generated by an optical detector;
generate a low frequency AC component of the monitoring signal without a DC component of the monitoring signal and without signal components of the monitoring signal having a frequency greater than the bandwidth of the optical detector;
generate a low frequency AC component of the data signal without a DC component of the data signal and without signal components of the data signal having a frequency greater than the bandwidth of the optical detector; and
generate the modulation current control signal that is transmitted to the optical driver based on a comparison by correlating the low frequency AC component of the monitoring signal and the low frequency AC component of the data signal.

* * * * *